United States Patent
Mikawa et al.

(10) Patent No.: US 10,720,326 B2
(45) Date of Patent: Jul. 21, 2020

(54) METHOD FOR GROWING GAN CRYSTAL AND C-PLANE GAN SUBSTRATE

(71) Applicant: MITSUBISHI CHEMICAL CORPORATION, Tokyo (JP)

(72) Inventors: Yutaka Mikawa, Tokyo (JP); Hideo Fujisawa, Tokyo (JP); Tae Mochizuki, Tokyo (JP); Hideo Namita, Tokyo (JP); Shinichiro Kawabata, Kawasaki (JP)

(73) Assignee: MITSUBISHI CHEMICAL CORPORATION, Tokyo (JP)

(*) Notice: Subject to any disclaimer, the term of this patent is extended or adjusted under 35 U.S.C. 154(b) by 0 days.

(21) Appl. No.: 16/270,454

(22) Filed: Feb. 7, 2019

(65) Prior Publication Data
US 2019/0189439 A1 Jun. 20, 2019

Related U.S. Application Data

(63) Continuation of application No. PCT/JP2017/028483, filed on Aug. 4, 2017.

(30) Foreign Application Priority Data

Aug. 8, 2016 (JP) ................................. 2016-155915

(51) Int. Cl.
*H01L 21/02* (2006.01)
*C30B 29/40* (2006.01)
(Continued)

(52) U.S. Cl.
CPC .......... *H01L 21/02389* (2013.01); *C30B 7/10* (2013.01); *C30B 7/105* (2013.01);
(Continued)

(58) Field of Classification Search
None
See application file for complete search history.

(56) References Cited

U.S. PATENT DOCUMENTS

| 2006/0099781 A1 | 5/2006 | Beaumont et al. |
| 2012/0251431 A1 | 10/2012 | Fujisawa et al. |

(Continued)

FOREIGN PATENT DOCUMENTS

| JP | 11-043398 A | 2/1999 |
| JP | 2002-231647 A | 8/2001 |

(Continued)

OTHER PUBLICATIONS

Dwiliński et al., "Excellent crystallinity of truly bulk ammonothermal GaN," Journal of Crystal Growth, vol. 310, Issue 17, 2008, pp. 3911-3916 (document filed on Feb. 7, 2019).

(Continued)

*Primary Examiner* — Asok K Sarkar
(74) *Attorney, Agent, or Firm* — Leason Ellis LLP

(57) ABSTRACT

A method for growing a GaN crystal suitable as a material of GaN substrates including C-plane GaN substrates includes: a first step of preparing a GaN seed having a nitrogen polar surface; a second step of arranging a pattern mask on the nitrogen polar surface of the GaN seed, the pattern mask being provided with a periodical opening pattern comprising linear openings and including intersections, the pattern mask being arranged such that longitudinal directions of at least part of the linear openings are within ±3° from a direction of an intersection line between the nitrogen polar surface and an M-plane; and a third step of ammonothermally growing a GaN crystal through the pattern mask such that a gap is formed between the GaN crystal and the pattern mask.

21 Claims, 17 Drawing Sheets

(51) Int. Cl.
  *C30B 33/06* (2006.01)
  *C30B 29/38* (2006.01)
  *C30B 7/10* (2006.01)

(52) U.S. Cl.
  CPC ............ *C30B 29/38* (2013.01); *C30B 29/406* (2013.01); *C30B 33/06* (2013.01); *H01L 21/0254* (2013.01); *H01L 21/0262* (2013.01); *H01L 21/02433* (2013.01); *H01L 21/02609* (2013.01); *H01L 21/02639* (2013.01); *H01L 21/02642* (2013.01); *H01L 21/02645* (2013.01); *H01L 21/02647* (2013.01)

(56) References Cited

U.S. PATENT DOCUMENTS

| 2013/0193558 | A1 | 8/2013 | Ju et al. |
| 2014/0147650 | A1 | 5/2014 | Jiang et al. |
| 2014/0167086 | A1 | 6/2014 | Jang et al. |
| 2015/0361587 | A1 | 12/2015 | Mikawa et al. |
| 2017/0327971 | A1 | 11/2017 | Fujisawa et al. |
| 2019/0010605 | A1* | 1/2019 | Iso ................... C30B 25/20 |

FOREIGN PATENT DOCUMENTS

| JP | 2001-288000 A | 10/2001 |
| JP | 2002-231647 A | 8/2002 |
| JP | 2004-193371 A | 7/2004 |
| JP | 2005-534182 A | 11/2005 |
| JP | 2009-519202 A | 5/2009 |
| JP | 2013-544739 A | 12/2013 |
| JP | 2014-111527 A | 6/2014 |
| JP | 2014-118346 A | 6/2014 |
| JP | 2014-208571 A | 11/2014 |
| WO | WO 2008/048303 A | 4/2008 |
| WO | WO 2008/048303 A2 | 4/2008 |
| WO | WO-2012/128263 A | 9/2012 |
| WO | WO-2016/125890 A1 | 8/2016 |

OTHER PUBLICATIONS

Dwiliński et al., "Recent achievements in AMMONO-bulk method," Journal of Crystal Growth, vol. 312, Issue 18, 2010, pp. 2499-2502 (document filed on Feb. 7, 2019).

International Preliminary Report on Patentability dated Feb. 21, 2019 for the corresponding International Application No. PCT/JP2017/028483.

International Search Report dated Nov. 7, 2017 for the corresponding PCT International Patent Application No. PCT/JP2017/028483.

Dwilinński et al., "Excellent crystallinity of truly bulk ammonothermal GaN ," Journal of Crystal Growth, vol. 310, Issue 17, 2008, pp. 3911-3916.

Dwilinński et al., "Recent achievements in AMMONO-bulk method," Journal of Crystal Growth, vol. 312, Issue 18, 2010, pp. 2499-2502.

Bao et al., Ammonothermal Crystal Growth of GaN Using an $NH_4F$ Mineralizer, Crystal Growth & Design, vol. 13, Issue 10, 2013, pp. 4158-4161.

* cited by examiner

METHOD FOR GROWING GAN CRYSTAL AND C-PLANE GAN SUBSTRATE

CROSS-REFERENCE TO RELATED APPLICATION

This is a continuation of International Application PCT/JP2017/028483, filed on Aug. 4, 2017, which designated the U.S. and claims priority from Japanese Patent Application 2016-155915 filed on Aug. 8, 2016, the entire contents of both are incorporated herein by reference.

TECHNICAL FIELD

The present invention mainly relates to a GaN crystal growth method and a C-plane GaN substrate.

BACKGROUND ART

GaN (gallium nitride) is one of Group III-V compound semiconductors and has a wurtzite crystal structure belonging to the hexagonal crystal system.

In recent years, GaN single crystal substrates have attracted attention as semiconductor substrates for nitride semiconductor devices.

Nitride semiconductors are also referred to as, for example, nitride-based group III-V compound semiconductors, group III nitride compound semiconductors, and GaN-based semiconductors, and include, in addition to GaN, a compound in which gallium in GaN is partially or fully substituted with another group 13 element (such as B, Al, and In) in the periodic table.

One of highly useful GaN single crystal substrates is a C-plane GaN substrate. The C-plane GaN substrate is a GaN single crystal substrate having a main surface parallel to or slightly tilted from the C-plane.

The C-plane GaN substrate has a gallium polar surface being a main surface on the [0001] side and a nitrogen polar surface being a main surface on the [000-1] side. So far, it is mainly the gallium polar surface that is used to form nitride semiconductor devices.

Cases where a C-plane GaN substrate was made from a GaN single crystal grown by an ammonothermal method have been reported (Non-Patent Document 1, Non-Patent Document 2).

In Patent Document 1, a GaN crystal was grown by an ammonothermal method on a C-plane GaN substrate provided with a pattern mask of a stripe type. $NH_4F$ (ammonium fluoride) was used singly as a mineralizer, and according to the description, a GaN crystal film having a flat top surface and a thickness of from 160 to 580 μm was grown through the pattern mask. It is unclear on which of the gallium polar surface and the nitrogen polar surface the pattern mask was formed.

In Patent Document 2, a GaN single crystal was grown by an ammonothermal method on a C-plane GaN substrate having a nitrogen polar surface on which a pattern mask of a stripe type was provided. $NH_4F$ and $NH_4I$ (ammonium iodide) were used in combination as mineralizers, and according to the description, after passing through the pattern mask, the GaN crystal further grew in the [000-1] direction without coalescence until the GaN crystal had a size of the order of millimeters in the C-axis direction.

Non-Patent Document 3 reported growth rates of GaN crystals obtained when various ammonium halide mineralizers were used in an ammonothermal method.

PRIOR ART DOCUMENT

Patent Documents

Patent Document 1: JP-A-2014-111527
Patent Document 2: JP-A-2014-208571

Non-Patent Literature

Non-Patent Document 1: R. Dwilinski, R. Doradzinski, J. Garczynski, L. P. Sierzputowski, A. Puchalski, Y. Kanbara, K. Yagi, H. Minakuchi, H. Hayashi, "Excellent crystallinity of truly bulk ammonothermal GaN", Journal of Crystal Growth 310 (2008) 3911-3916.

Non-Patent Document 2: R. Dwilinski, R. Doradzinski, J. Garczynski, L. Sierzputowski, R. Kucharski, M. Zajac, M. Rudzinski, R. Kudrawiec, J. Serafnczuk, W. Strupinski, "Recent achievements in AMMONO-bulk method", Journal of Crystal Growth 312 (2010) 2499-2502.

Non-Patent Document 3: Quanxi Bao, Makoto Saito, Kouji Hazu, Kentaro Furusawa, Yuji Kagamitani, Rinzo Kayano, Daisuke Tomida, Kun Qiao, Tohru Ishiguro, Chiaki Yokoyama, Shigefusa F. Chichibu, "Ammonothermal Crystal Growth of GaN Using an $NH_4F$ Mineralizer", Crystal Growth & Design 4158-4161 (2013) 13.

SUMMARY OF INVENTION

Problem to be Solved by Invention

A main object of the present invention is to provide a novel method for growing a GaN crystal suitable as a material of GaN substrates including C-plane GaN substrates.

Another object of the present invention is to provide a novel C-plane GaN substrate which may be preferably used, for example, for producing nitride semiconductor devices.

Means for Solving the Problem

Embodiments of the present invention include the following.

[1] A method for growing a GaN crystal, comprising:
a first step of preparing a GaN seed having a nitrogen polar surface; a second step of arranging a pattern mask on the nitrogen polar surface of the GaN seed, the pattern mask being provided with a periodical opening pattern comprising linear openings and including intersections, the pattern mask being arranged such that longitudinal directions of at least part of the linear openings are within ±3° from a direction of an intersection line between the nitrogen polar surface and an M-plane; and a third step of ammonothermally growing a GaN crystal on the nitrogen polar surface of the GaN seed through the pattern mask such that a gap is formed between the GaN crystal and the pattern mask.

[2] The growth method described in [1] above, wherein the intersections are continuous intersections.

[3] The growth method described in [1] or [2] above, wherein mineralizers used in the third step include $NH_4F$ and one or more ammonium halides selected from $NH_4Cl$, $NH_4Br$, and $NH_4I$.

[4] The growth method described in [3] above, wherein the mineralizers used in the third step include $NH_4I$ and $NH_4F$.

[5] The growth method described in [4] above, wherein the GaN crystal contains F and I.

[6] The growth method described in any one of [1] to [5] above, wherein in the second step, the pattern mask is arranged such that longitudinal directions of portions of the linear openings which account for 50% or more of the total length thereof are within ±3° from a direction of an intersection line between the nitrogen polar surface and an M-plane.

[7] The growth method described in any one of [1] to [6] above, wherein in the second step, the pattern mask is arranged such that longitudinal directions of all portions of the linear openings are within ±3° from a direction of an intersection line between the nitrogen polar surface and an M-plane.

[8] The growth method described in any one of [1] to [7] above, wherein the arrangement of the intersections in the periodical opening pattern is two-dimensional.

[9] The growth method described in [8] above, wherein the pattern mask includes the intersections at a number density of 1 $cm^{-2}$ or more.

[10] The growth method described in [9] above, wherein the pattern mask includes the intersections at a number density of 20 $cm^{-2}$ or less.

[11] The growth method described in any one of [1] to [10] above, wherein every non-opening part included in a unit pattern of the pattern mask is quadrangular or hexagonal, and none of the linear openings included in the pattern mask is arranged at a pitch of less than 1 mm.

[12] The growth method described in [11] above, wherein the pattern mask includes the linear openings arranged at a pitch of 10 mm or less.

[13] The growth method described in [11] above, wherein the pattern mask includes the linear openings arranged at a pitch of 2 mm or less and the linear openings arranged at a pitch of more than 2 mm, includes the linear openings arranged at a pitch of 3 mm or less and the linear openings arranged at a pitch of more than 3 mm, or includes the linear openings arranged at a pitch of 4 mm or less and the linear openings arranged at a pitch of more than 4 mm.

[14] The growth method described in [13] above, wherein the pattern mask includes the linear openings arranged at a pitch of more than 4 mm.

[15] The growth method descried in any one of [1] to [14] above, wherein the periodical opening pattern is a quadrangular grid pattern, and in the second step, the pattern mask is provided with first linear openings and second linear openings where the longitudinal direction of the first linear openings and the longitudinal direction of the second linear openings differ from each other.

[16] The growth method described in [15] above, wherein one of a pitch between the first linear openings and a pitch between the second linear openings is not less than 1.5 times the other.

[17] The growth method described in any one of [1] to [16] above, wherein in the third step, a void is formed between the GaN crystal and the pattern mask.

[18] The growth method described in [17] above, wherein in the third step, the GaN crystal is grown such that no through-hole remains above the non-opening parts of the pattern mask.

[19] The growth method described in any one of [1] to [18] above, wherein the GaN seed has a size of 45 mm or more in all of a [1-100] direction, a [10-10] direction, and a [01-10] direction.

[20] The growth method described in any one of [1] to [19] above, wherein the GaN crystal has a size of 45 mm or more in all of a [1-100] direction, a [10-10] direction, and a [01-10] direction.

[21] The growth method described in any one of [1] to [20] above, wherein a C-plane GaN substrate having a size of 45 mm or more in all of a [1-100] direction, a [10-10] direction, and a [01-10] direction can be cut out from the GaN crystal.

[22] A method for producing a C-plane GaN substrate, comprising the steps of: producing a GaN crystal by the growth method described in any one of [1] to [21] above; and processing the grown GaN crystal.

[23] The production method described in [22] above, wherein the step of processing comprises a sub-step of slicing the grown GaN crystal parallel to or substantially parallel to a C-plane.

[24] A C-plane GaN substrate, having a plurality of dislocation arrays periodically arranged at least on one main surface of the substrate, wherein no group of dislocations except the plurality of dislocation array is periodically present on the one main surface, wherein the plurality of dislocation arrays are all derived from coalescence occurred during growth of a GaN crystal forming the substrate.

[25] The C-plane GaN substrate described in [24] above, wherein the arrangement of the plurality of dislocation arrays on the main surface is two-dimensional.

[26] The C-plane GaN substrate described in [24] or [25] above, wherein the arrangement of the plurality of dislocation arrays on the main surface has periodicity in two or more directions.

[27] A C-plane GaN substrate, having a plurality of dislocation arrays periodically and two-dimensionally arranged at least on one main surface of the substrate, wherein no group of dislocations except the plurality of dislocation arrays is periodically present on the one main surface.

[28] The C-plane GaN substrate described in [27] above, wherein the arrangement of the plurality of dislocation arrays on the main surface has periodicity in two or more directions.

[29] The C-plane GaN substrate described in any one of [24] to [28] above, wherein concentrations of Li, Na, K, Mg, and Ca are each less than $1\times10^{16}$ atoms/$cm^3$.

[30] The C-plane GaN substrate described in any one of [24] to [29] above, wherein the substrate contains F.

[31] The C-plane GaN substrate described in [30] above, wherein the substrate contains, in addition to F, one or more halogens selected from Cl, Br, and I.

[32] The C-plane GaN substrate described in [31] above, wherein the substrate contains F and I.

[33] The C-plane GaN substrate described in any one of [24] to [32] above, wherein the substrate has an H concentration of not less than $5\times10^{17}$ atoms/$cm^3$ and not more than $1\times10^{20}$ atoms/$cm^3$.

[34] The C-plane GaN substrate described in any one of [24] to [33] above, wherein the substrate comprises a GaN crystal having an infrared absorption peak attributable to a gallium vacancy-hydrogen complex within a range of 3140 to 3200 $cm^{-1}$.

[35] The C-plane GaN substrate described in any one of [24] to [34], wherein the substrate has a resistivity of $2\times10^{-2}$ Ω·cm or less at room temperature.

[36] The C-plane GaN substrate described in any one of [24] to [35] above, wherein the substrate has an n-type carrier concentration of $1\times10^{18}$ $cm^{-3}$ or more at room temperature.

[37] The C-plane GaN substrate described in any one of [24] to [36] above, wherein the substrate has an O concentration higher than an n-type carrier concentration at room temperature.

[38] The C-plane GaN substrate described in [37] above, wherein the n-type carrier concentration at room temperature is from 20 to 70% of the O concentration.

[39] The C-plane GaN substrate described in any one of [24] to [38] above, wherein the substrate has a size of 45 mm or more in all of a [1-100] direction, a [10-10] direction, and a [01-10] direction.

[40] The C-plane GaN substrate described in any one of [24] to [39] above, wherein the substrate is disk-shaped and has a diameter of 45 mm or more.

[41] The C-plane GaN substrate described in any one of [24] to [40] above, wherein the substrate has a gallium polar surface having an orientation of within 5° from [0001].

[42] A method for producing a nitride semiconductor device, comprising the steps of: preparing the C-plane GaN substrate described in any one of [24] to [41] above; and epitaxially growing at least one nitride semiconductor on the prepared C-plane GaN substrate.

[43] A method for producing an epitaxial substrate, comprising the steps of: preparing the C-plane GaN substrate described in any one of [24] to [41] above; and epitaxially growing at least one nitride semiconductor on the prepared C-plane GaN substrate.

[44] A method for producing a bulk nitride semiconductor crystal, comprising the steps of: preparing the C-plane GaN substrate described in any one of [24] to [41] above; and epitaxially growing one or more nitride semiconductor crystals on the prepared C-plane GaN substrate.

[45] A method for producing a GaN layer-bonded substrate, comprising the steps of: preparing the C-plane GaN substrate described in any one of [24] to [41] above; and bonding the prepared C-plane GaN substrate to a heterogeneous substrate.

Effect of the Invention

According to a preferred embodiment, a novel method for growing a GaN crystal suitable as a material of GaN substrates including C-plane GaN substrates is provided.

According to another embodiment, a novel C-plane GaN substrate which may be preferably used, for example, for producing nitride semiconductor devices is provided.

DESCRIPTION OF EMBODIMENTS

In a GaN crystal, a crystal axis parallel to [0001] and [000-1] is referred to as a c-axis, a crystal axis parallel to <10-10> is referred to as an m-axis, and a crystal axis parallel to <11-20> is referred to as an a-axis. A crystal plane perpendicular to the c-axis is referred to as a C-plane, a crystal plane perpendicular to the m-axis is referred to as an M-plane, and a crystal plane perpendicular to the a-axis is referred to as an A-plane.

In the present specification, unless otherwise noted, references made to a crystal axis, a crystal plane, a crystal orientation, and the like are assumed to mean a crystal axis, a crystal plane, a crystal orientation, and the like of a GaN crystal.

Embodiments of the present invention will be described below with reference to drawings as required.

1. GaN Crystal Growth Method

Figure 1:
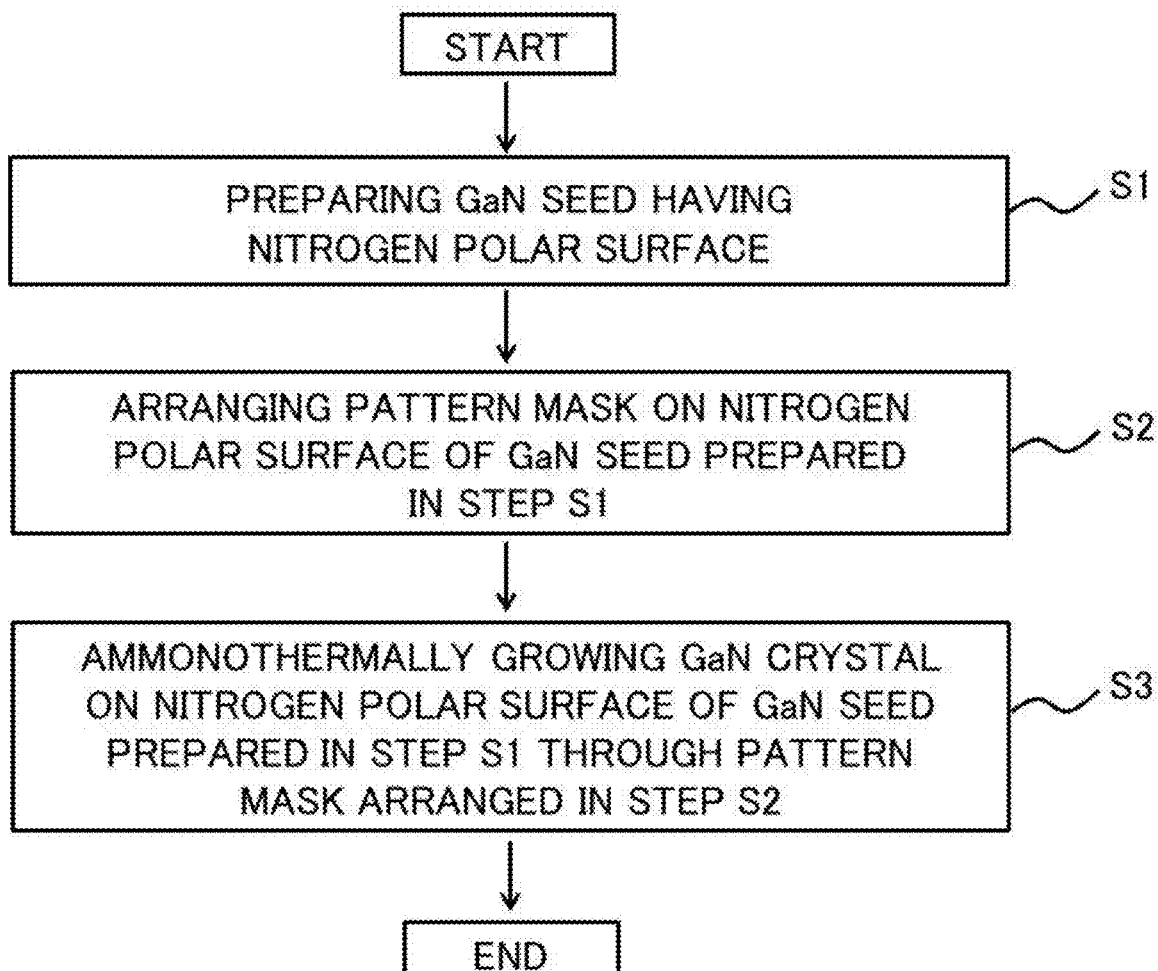
FIG. 1 is a flow chart of a GaN crystal growth method according to an embodiment.

A flow chart of a GaN crystal growth method according to one embodiment is given in FIG. 1. The GaN crystal growth method comprises the following sequentially executed steps S1-S3.

S1: preparing a GaN seed having a nitrogen polar surface.

S2: arranging a pattern mask on the nitrogen polar surface of the GaN seed prepared in the step S1.

S3: ammonothermally growing a GaN crystal on the nitrogen polar surface of the GaN seed prepared in the step S1 through the pattern mask arranged in the step S2.

Details of the steps S1-S3 will be described below.

1.1. Step S1

The step S1 is a step of preparing a GaN seed having a nitrogen polar surface.

A typical example of the GaN seed is a C-plane GaN substrate. In the C-plane GaN substrate, a main surface on the [0001] side is a gallium polar surface, and a main surface on the [000-1] side is a nitrogen polar surface.

A preferred GaN seed is a C-plane GaN substrate obtained by processing a bulk GaN crystal grown by an HVPE method or acidic ammonothermal method, and may be made of a bulk GaN crystal grown by a method described in this section 1. here.

When the bulk GaN crystal as a material for C-plane GaN substrate is grown by an HVPE method, a growth technique such as DEEP (Dislocation Elimination by the Epitaxial-growth with inverse-pyramidal Pits) [K. Motoki et al., Journal of Crystal Growth 237-239 (2002) 912], VAS (Void-Assisted Separation) [Y. Oshima et al., Japanese Journal of Applied Physics 42 (2003) L1], and Advanced-DEEP [K. Motoki et al., Journal of Crystal Growth 305 (2007) 377] may be used appropriately. When Advanced-DEEP is used, preferably, it is ensured that dot cores (a dot core is a dot domain with an inversed polarity) are formed in a GaN crystal to be grown, and the arrangement of the dot cores is set so as not to overlap with an opening pattern to be provided on a pattern mask in the later step S2.

The orientation of the nitrogen polar surface of the GaN seed is preferably within 2° from [000-1] when expressed by the direction of the normal vector. This means that an angle formed by the normal vector of the nitrogen polar surface with [000-1] is within 2°. More preferably, the orientation of the nitrogen polar surface of the GaN seed is within 1° from [000-1].

The nitrogen polar surface of the GaN seed may has an area of, for example, 15 cm$^2$ or more and less than 50 cm$^2$, 50 cm$^2$ or more and less than 100 cm$^2$, 100 cm$^2$ or more and less than 200 cm$^2$, 200 cm$^2$ or more and less than 350 cm$^2$, 350 cm$^2$ or more and less than 500 cm$^2$, or 500 cm$^2$ or more and less than 750 cm$^2$.

When the nitrogen polar surface of the GaN seed is circular, the surface has a diameter of usually not less than 45 mm and not more than 305 mm. The diameter is typically from 45 to 55 mm (about 2 inches), from 95 to 105 mm (about 4 inches), from 145 to 155 mm (about 6 inches), from 195 to 205 mm (about 8 inches), from 295 to 305 mm (about 12 inches), and the like.

For example, when the GaN seed is a C-plane GaN substrate with a diameter of 50 mm, its thickness is preferably 300 μm or more, and when with a larger diameter, a preferred lower limit value of its thickness is also greater.

The thickness of the GaN seed has no particular upper limit, but is usually 20 mm or less.

The size of the GaN seed is determined in consideration of the size of the GaN crystal to be grown in the later step S3.

For example, when it is intended to cut out, from a GaN crystal to be grown, a C-plane GaN substrate whose size is 45 mm in all of the [1-100] direction, the [10-10] direction, and the [01-10] direction, the GaN crystal has to be grown to have a size of 45 mm or more in all of the [1-100] direction, the [10-10] direction, and the [01-10] direction. To grow a C-plane GaN substrate whose size is 45 mm in all of the [1-100] direction, the [10-10] direction, and the [01-10] direction, it is preferable to use a GaN seed whose size is 45 mm or more in all of the [1-100] direction, the [10-10] direction, and the [01-10] direction.

The nitrogen polar surface of the GaN seed is usually planarized by polishing or grinding. Preferably, by CMP (Chemical Mechanical Polishing) and/or etching, a damaged layer introduced by the planarization process is removed from the nitrogen polar surface.

1.2. Step S2

In the step S2, a pattern mask is arranged on the nitrogen polar surface of the GaN seed prepared in the step S1.

The material to form the surface of the pattern mask is preferably a metal selected from platinum-group metals, namely, Ru (ruthenium), Rh (rhodium), Pd (palladium), Os (osmium), Ir (iridium), and Pt (platinum), and the material is particularly preferably Pt. While the pattern mask may be a single layer film made of a platinum-group metal or its alloy, the pattern mask is preferably a multilayer film formed by laminating a platinum-group metal layer as a surface layer on a base layer made of a metal with a better adhesion to a GaN crystal than that of platinum-group metals. Examples of the material for the base layer include, without limitation, W (tungsten), Mo (molybdenum), Ti (titanium), and alloys containing at least one selected from these.

The pattern mask is provided with a periodical opening pattern comprising linear openings, and particularly the periodical opening pattern including intersections.

One example will be described referring to FIGS. 2A, 2B and 3.

Figure 2A:
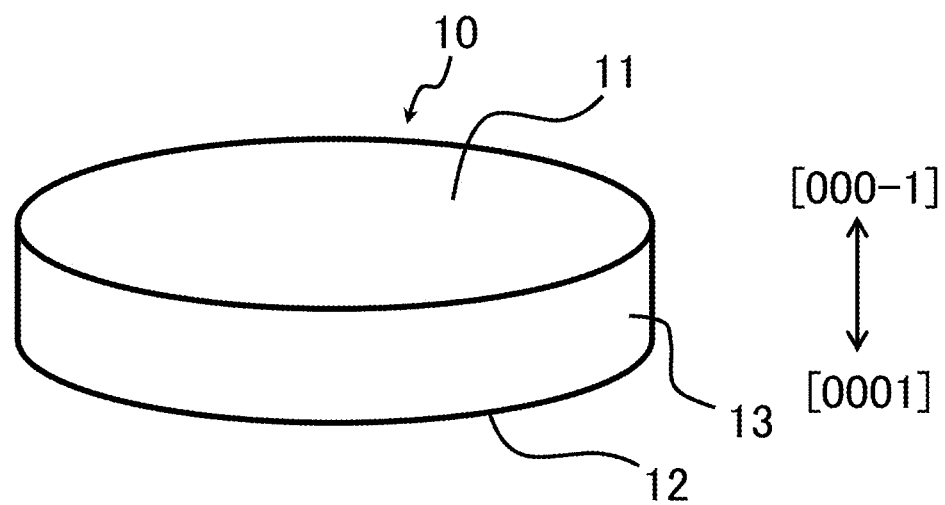
FIG. 2A is a perspective view illustrating a GaN seed.

FIG. 2A is a perspective view illustrating an example of a GaN seed. A GaN seed 10 is a disc-shaped C-plane GaN substrate which has a nitrogen polar surface 11, a gallium polar surface 12, and a side surface 13.

Figure 2B:
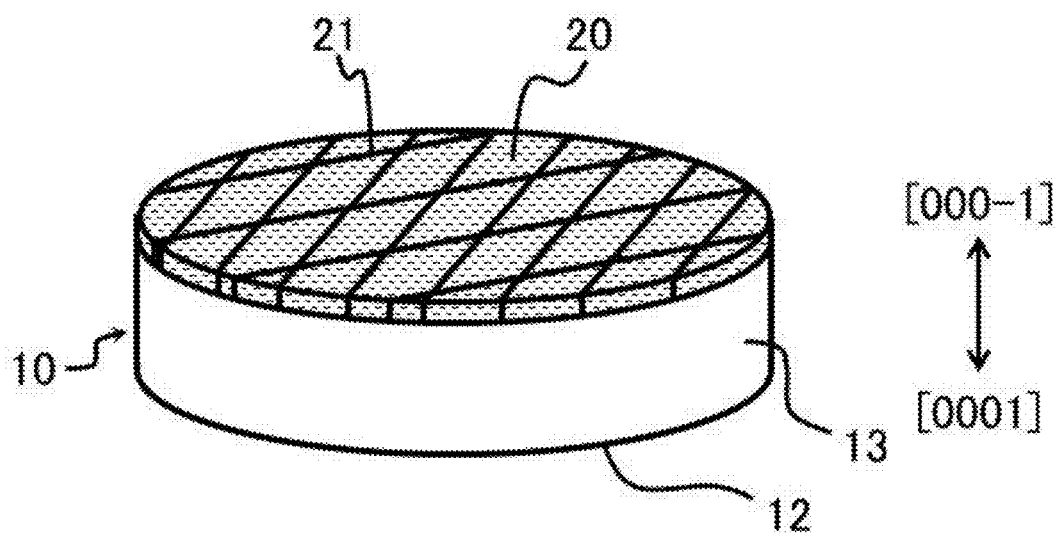
FIG. 2B is a perspective view illustrating the GaN seed after arrangement of a pattern mask on the nitrogen polar surface.

FIG. 2B is a perspective view illustrating the GaN seed 10 after arrangement of a pattern mask 20 on the nitrogen polar surface 11. The pattern mask 20 is provided with a quadrangular grid pattern comprising linear openings 21.

Figure 3:
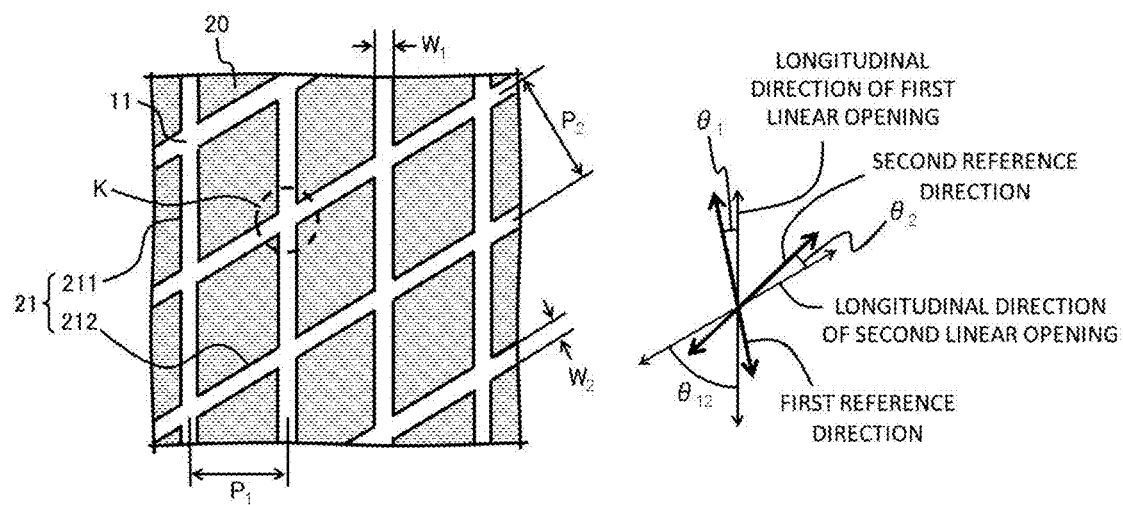
FIG. 3 is a plan view illustrating part of the nitrogen polar surface side of a GaN seed after arrangement of a pattern mask.

FIG. 3 is a plan view illustrating part of the nitrogen polar surface 11 side of the GaN seed 10 after arrangement of the pattern mask 20.

Referring to FIG. 3, the pattern mask 20 is provided with the linear openings 21, and the nitrogen polar surface 11 of the GaN seed is exposed inside the linear openings 21.

The pattern mask 20 is provided with two kinds of the linear openings 21, that is, a first linear opening 211 and a second linear opening 212 whose longitudinal directions differ from each other. A plurality of the first linear openings 211 and a plurality of the second linear openings 212 form a quadrangular grid pattern.

A pitch $P_1$ between the first linear openings 211 and a pitch $P_2$ between the second linear openings 212 are each constant. The pitch means a distance between center lines of linear openings parallel and adjacent to each other across a non-opening part of a pattern mask.

The pitches $P_1$ and $P_2$ may be the same or different. According to the present inventors' findings through experience, when the pitches $P_1$ and $P_2$ are different, through-holes to be created above the non-opening parts of the pattern mask tend to easily close when a GaN crystal is grown in the later step S3. Thus, one of the pitches $P_1$ and $P_2$ is preferably not less than 1.5 times the other and more preferably not less than twice the other.

The directions of the first linear opening 211 and the second linear opening 212 are conveniently expressed when one of directions of intersection lines between the nitrogen polar surface 11 and the M-plane of the GaN seed is selected as a first reference direction with another one as a second reference direction. For example, when the first reference direction is the direction of the intersection line between the nitrogen polar surface 11 and the (1-100) plane, the second reference direction is the direction of the intersection line between the nitrogen polar surface 11 and the (10-10) plane or the (01-10) plane.

At least any one of an angle $\theta_1$ formed by the longitudinal direction of the first linear opening 21 with the first reference direction and an angle $\theta_2$ formed by the longitudinal direction of the second linear opening 22 with the second reference direction is within ±3°.

When the total length of the first linear openings 211 is equal to or longer than the total length of the second linear openings 212, at least the angle $\theta_1$ is within ±3°. In other words, it is preferable that longitudinal directions of portions of the linear openings 21 which account for 50% or more of the total length thereof are within ±3° from the direction of the intersection line between the nitrogen polar surface and the M-plane of the GaN seed.

In a more preferred example, both of the angles $\theta_1$ and $\theta_2$ are within ±3°, that is, longitudinal directions of all portions of the linear openings 21 are within ±3° from the direction of the intersection line between the nitrogen polar surface and the M-plane of the GaN seed.

In any case, the angles $\theta_1$ and $\theta_2$ are more preferably within ±2° and further preferably within ±1°.

The quadrangular grid pattern provided on the pattern mask 20 includes an intersection K formed by the first linear opening 211 and the second linear opening 212. As will be described later, provision of intersections to the opening pattern is advantageous in promoting the closure of through-holes to be created above the non-opening parts of the pattern mask when a GaN crystal is grown in the later step S3. From this point of view, the pattern mask includes intersections at a number density of preferably 1 $cm^{-2}$ or more.

On the other hand, when it is taken into consideration that to increase the number density of the intersections requires to increase the density of the linear openings and that as the density of the linear openings increases, the dislocation defects which a GaN crystal to be grown in the later step S3 will inherit from the GaN seed will increase, the number density is preferably 20 $cm^{-2}$ or less, more preferably 15 $cm^{-2}$ or less, and more preferably 10 $cm^{-2}$ or less.

In order to reduce dislocation defects which a GaN crystal to be grown in the later step S3 will inherit from the GaN seed 10, it is advantageous that the first linear opening 211 and the second linear opening 212 have narrow line widths $W_1$ and $W_2$, respectively. Thus, the line widths $W_1$ and $W_2$ are each preferably 0.5 mm or less, more preferably 0.2 mm or less, and more preferably 0.1 mm or less.

From the viewpoint of production efficiency, it is preferable that the line width $W_1$ of the first linear opening 211 and the line width $W_2$ of the second linear opening 212 are moderately wide. That way, during the growth of a GaN crystal in the later step S3, the growth rate at an early stage will be increased. Thus, the line widths $W_1$ and $W_2$ are each preferably 5 μm or more, more preferably 20 μm or more, and more preferably 40 μm or more.

In order to reduce dislocation defects which a GaN crystal to be grown in the later step S3 will inherit from the GaN seed 10, it is advantageous that the pitch $P_1$ between the first linear openings 211 and the pitch $P_2$ between the second linear openings 212 are large. Thus, the pitches $P_1$ and $P_2$ are preferably 1 mm or more, more preferably 2 mm or more, more preferably 3 mm or more, and more preferably 4 mm or more.

The larger the pitches $P_1$ and $P_2$ are, the longer it takes for through-holes to be created above the non-opening parts of the pattern mask to close when a GaN crystal is grown in the later step S3. Thus, from the viewpoint of production efficiency, it is preferable that at least one of the pitches $P_1$ and $P_2$ is 10 mm or less. In one example, one or both of the pitches $P_1$ and $P_2$ may be 4 mm or less, further 3 mm or less, or still further 2 mm or less.

In a preferred example, taking both reduction of inherited dislocation defects and improvement of production efficiency into consideration, only one of the pitches $P_1$ and $P_2$ may be 4 mm or less, 3 mm or less, or 2 mm or less.

The periodical opening pattern that may be provided on a pattern mask arranged on a GaN seed in the step S2 is not limited to a quadrangular grid pattern.

Diagrams included in FIGS. 4A to 6D are plan views each illustrating a GaN seed after arrangement of a pattern mask on the nitrogen polar surface and giving an example of various periodical opening patterns which may be provided on the pattern mask. Adoptable opening patterns are, however, not limited to these examples.

Figure 4A:
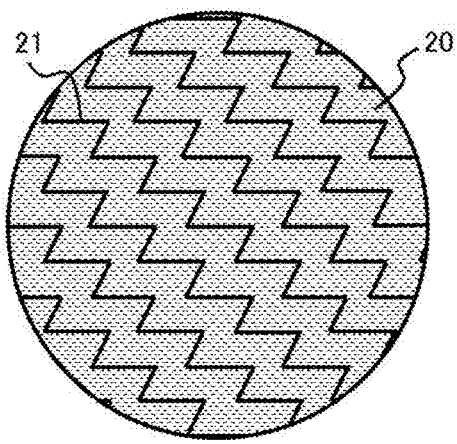
FIGS. 4A to 4D are plan views each illustrating a GaN seed with a pattern mask arranged on the nitrogen polar surface.

In FIG. 4A, the linear openings 21 form a zigzag stripe pattern.

Figure 4C:
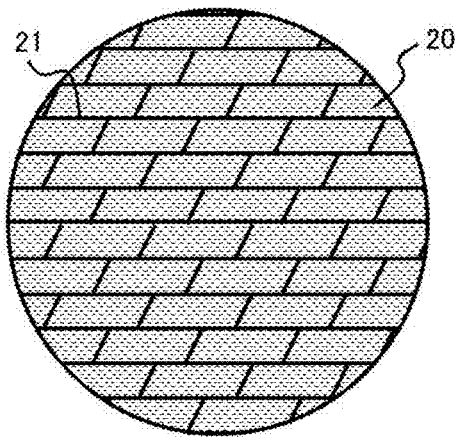
Figure 4B:
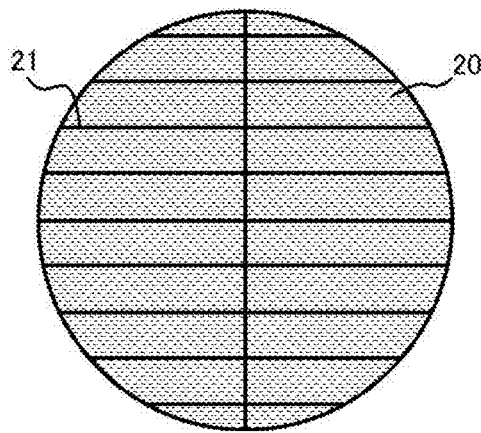

In FIG. 4B, the linear openings 21 form a kind of grid pattern.

In FIG. 4C, the linear openings 21 form a slanted brick grid pattern.

Figure 4D:
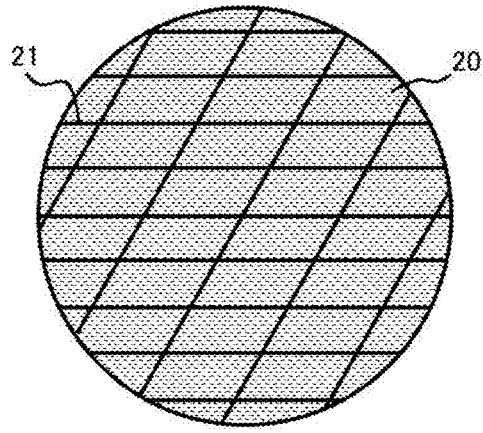

In FIG. 4D, the linear openings 21 form a slanted rectangular grid pattern.

Figure 5A:
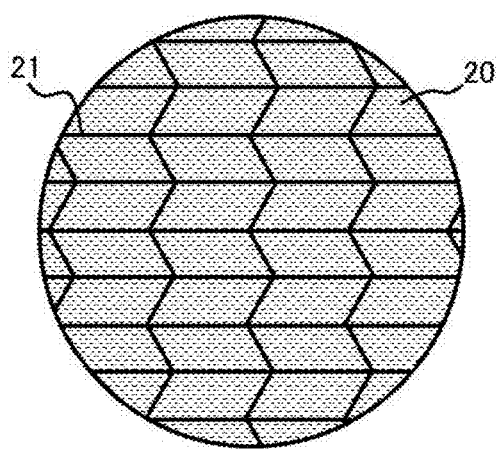
FIGS. 5A to 5D are plan views each illustrating a GaN seed with a pattern mask arranged on the nitrogen polar surface.

In FIG. 5A, the linear openings 21 form a herringbone grid pattern.

Figure 5C:
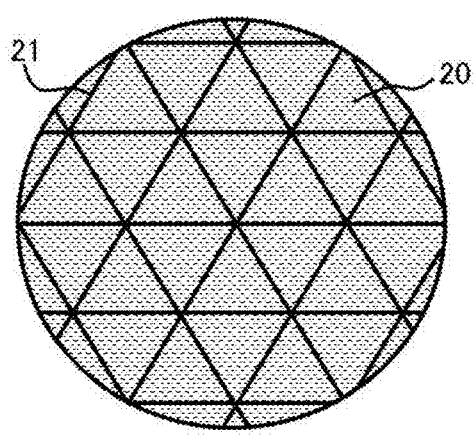
Figure 5B:
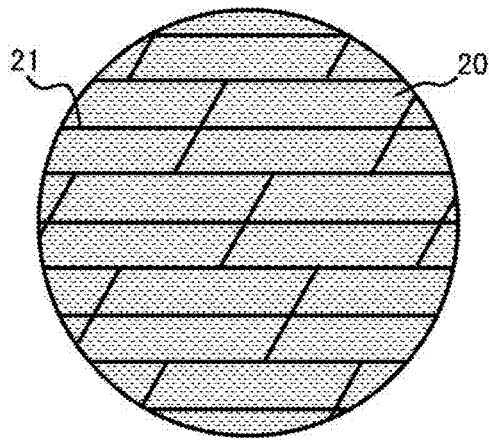

In FIG. 5B, the linear openings 21 form a grid pattern combining a slanted brick grid and a slanted rectangular grid.

In FIG. 5C, the linear openings 21 form a triangular grid pattern.

Figure 5D:
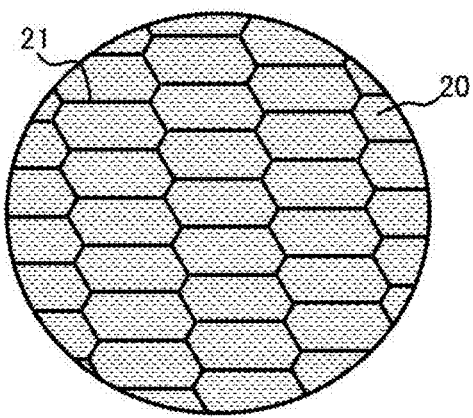

In FIG. 5D, the linear openings 21 form a flat honeycomb grid pattern.

Figure 6A:
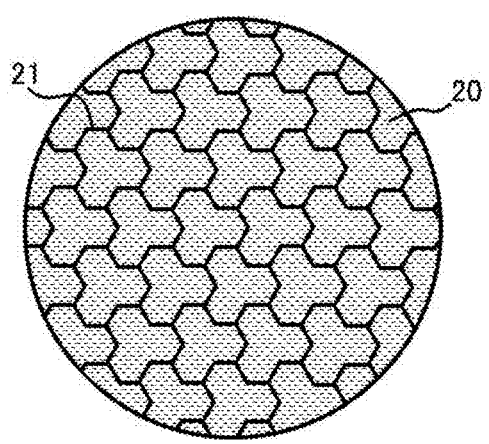
FIGS. 6A to 6D are plan views each illustrating a GaN seed with a pattern mask arranged on the nitrogen polar surface.

In FIG. 6A, the linear openings 21 form a bishamon-kikko pattern.

Figure 6B:
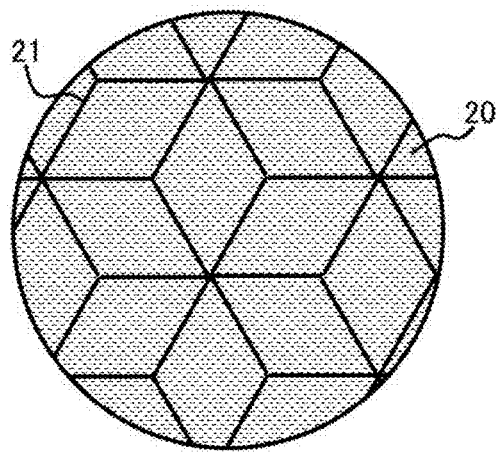
Figure 6C:
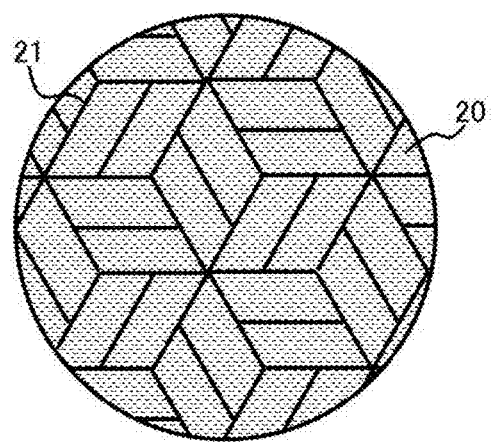

In each of FIGS. 6B and 6C, the linear openings 21 form a cubic pattern.

Figure 6D:
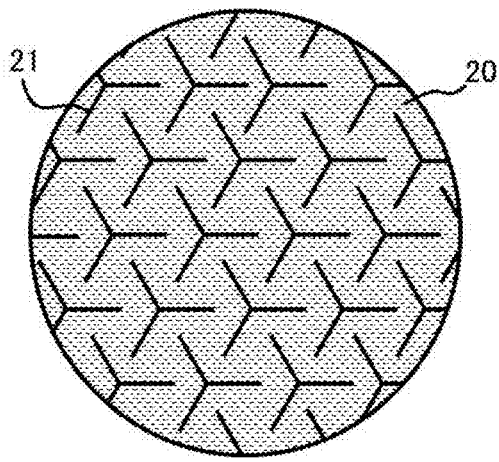
Figure 7A:
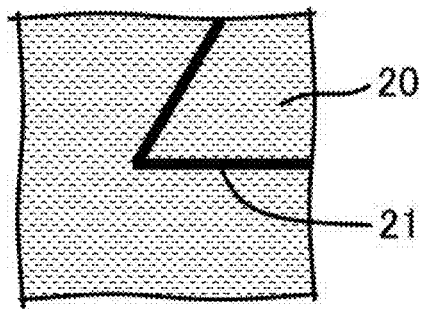
FIGS. 7A to 7F are plan views each illustrating part of a pattern mask formed on the nitrogen polar surface of a GaN seed.
Figure 7D:
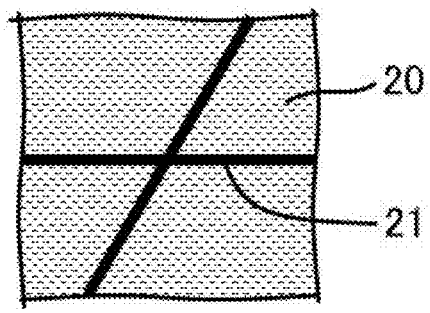
Figure 7B:
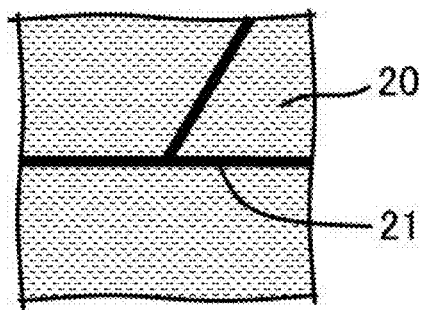
Figure 7E:
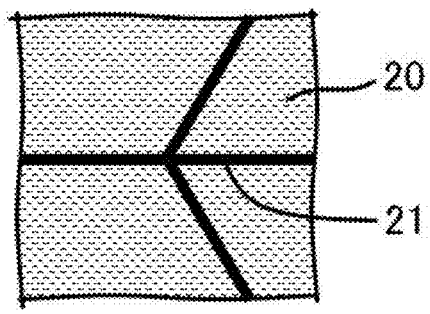
Figure 7C:
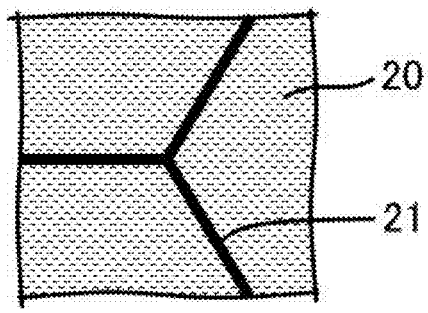
Figure 7F:
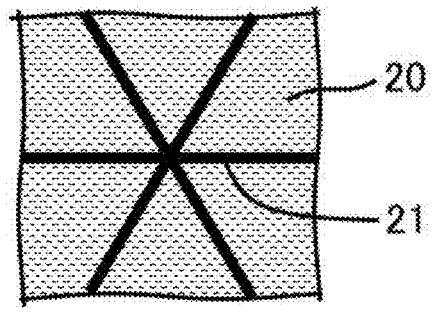
Figure 8A:
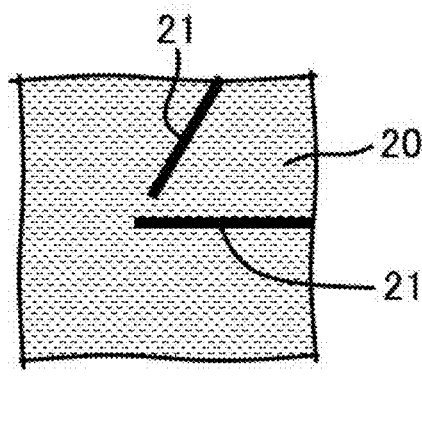
FIGS. 8A to 8F are plan views each illustrating part of a pattern mask formed on the nitrogen polar surface of a GaN seed.
Figure 8B:
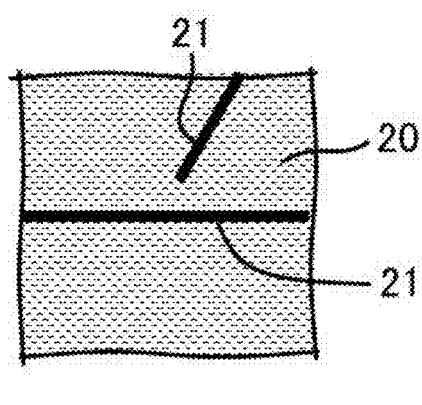
Figure 8C:
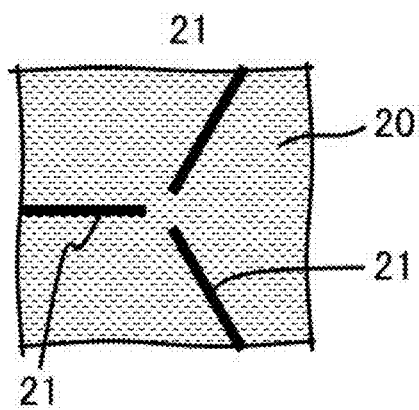
Figure 8D:
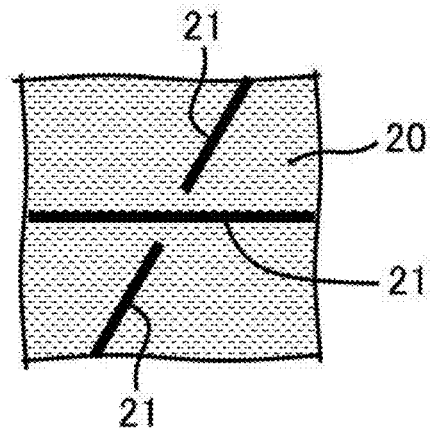
Figure 8E:
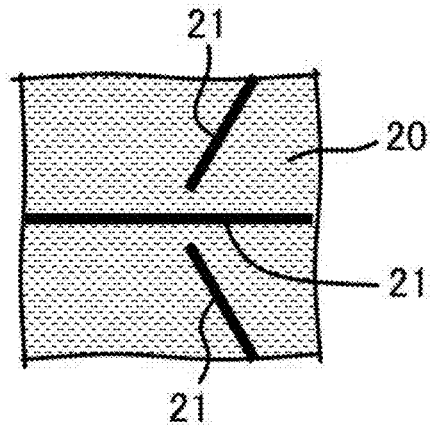
Figure 8F:
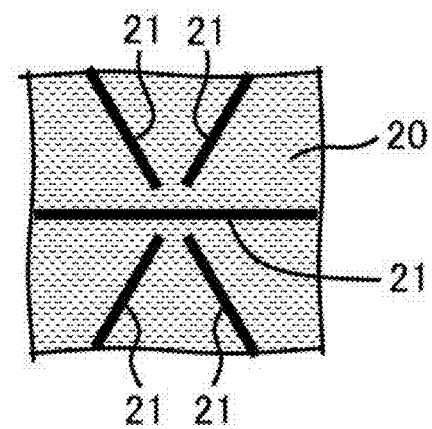

In FIG. 6D, the linear openings 21 form a Y-shaped pattern.

In any of the examples illustrated in FIGS. 4A to 6D, the periodical opening pattern provided on the pattern mask 20 includes intersections. Some types of intersection are shown in FIGS. 7A to 8F.

Including the intersections illustrated in FIGS. 7A to 7F, an intersection where two or more linear openings whose longitudinal directions differ from each other are connected, is herein referred to as a continuous intersection.

Unless otherwise noted, an intersection herein encompasses not only a continuous intersection but also a discontinuous intersection, examples of which are given in FIGS. 8A to 8F. A discontinuous intersection may be considered to be an intersection obtained by modifying a continuous intersection such that the connection between linear openings is disconnected.

In discontinuous intersections, the distance between two linear openings separated by a non-opening part is 300 μm or less and preferably 200 μm or less.

In FIGS. 4A to 6D, the intersections in the periodical opening patterns are two-dimensionally arranged in all examples except the example in FIG. 4B.

Inclusion of the intersections in the periodical opening pattern facilitates the closure of through-holes to be created above the non-opening parts of the pattern mask when a GaN crystal is grown in the later step S3. This effect is significant when the arrangement of the intersections in the periodical opening pattern is two-dimensional, and becomes more significant when the number density of the intersections is increased.

Accordingly, it is preferable that the arrangement of the intersections in a periodical opening pattern is two-dimensional, where the pattern mask includes the intersections at a number density of preferably 1 $cm^{-2}$ or more. However, when it is taken into consideration that to increase the number density of the intersections requires to increase the density of the linear openings and that as the density of the linear openings increases, the dislocation defects which a GaN crystal to be grown in the later step S3 will inherit from the GaN seed will increase, the number density of the intersections is preferably 20 $cm^{-2}$ or less, more preferably 15 $cm^{-2}$ or less, and more preferably 10 $cm^{-2}$ or less.

In providing the various periodical opening patterns illustrated in FIGS. 4A to 6D on the pattern masks, preferred designs of the orientation, line widths, and pitches of the linear openings are as follows.

The longitudinal directions of at least part of the linear openings are within ±3° from the direction of the intersection line between the nitrogen polar surface and the M-plane of the GaN seed. More preferably, longitudinal directions of portions of the linear openings which account for 50% or more of the total length thereof and further preferably longitudinal directions of all portions of the linear openings are within ±3° from the direction of the intersection line between the nitrogen polar surface and the M-plane of the GaN seed.

The linear openings each have a line width of preferably 0.5 mm or less, more preferably 0.2 mm or less, and more preferably 0.1 mm or less and preferably 5 µm or more, more preferably 20 µm or more, and more preferably 40 µm or more. The line widths need not to be the same in all portions of the linear openings.

When every non-opening part included in a unit pattern of the pattern mask is quadrangular or hexagonal, the following applies to the pitch between linear openings.

From the viewpoint of reduction of dislocation defects which a GaN crystal to be grown on the GaN seed will inherit from the GaN seed, the pattern mask preferably does not include any linear openings arranged at a pitch of less than 1 mm, more preferably does not include any linear openings arranged at a pitch of less than 2 mm, more preferably does not include any linear openings arranged at a pitch of less than 3 mm, and more preferably does not include any linear openings arranged at a pitch of less than 4 mm.

On the other hand, from the viewpoint of improvement of production efficiency, the pattern mask preferably includes linear openings arranged at a pitch of 10 mm or less and may include linear openings arranged at a pitch of 4 mm or less, 3 mm or less, or 2 mm or less.

Taking both of the above viewpoints into consideration, the pattern mask may be provided with linear openings arranged at a pitch of not less than 1 mm and not more than 4 mm and linear openings arranged at a pitch of more than 4 mm, may be provided with linear openings arranged at a pitch of not less than 1 mm and not more than 3 mm and linear openings arranged at a pitch of more than 3 mm, or may be provided with linear openings arranged at a pitch of not less than 1 mm and not more than 2 mm and linear openings arranged at a pitch of more than 2 mm. In any of these cases, the pattern mask may be provided with linear openings arranged at a pitch of more than 4 mm.

Among the examples illustrated in FIGS. 4A to 6D, the pattern mask in which all the non-opening parts included in a unit pattern are quadrangular is illustrated in FIGS. 4C, 4D, 5A, 5B, 6B, and 6C. In the example in FIG. 5D where the periodical opening pattern is a flat honeycomb pattern, all the non-opening parts included in a unit pattern of the pattern mask are hexagonal.

1.3. Step S3

In the step S3, a GaN crystal is ammonothermally grown on the nitrogen polar surface of the GaN seed prepared in the step S1 through the pattern mask arranged in the step S2.

The growth process of the GaN crystal in the step S3 will be described referring to FIGS. 9A to 9E.

Figure 9A:
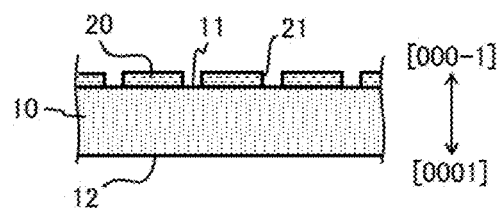
FIGS. 9A to 9E are cross-sectional views illustrating the course of the growth of a GaN crystal.

FIG. 9A is a cross-sectional view illustrating the state before the start of crystal growth. The pattern mask 20 having the linear openings 21 is provided on the nitrogen polar surface 11 of the GaN seed 10.

Figure 9D:
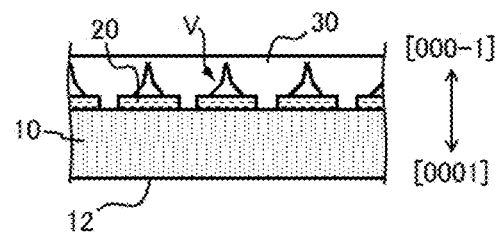
Figure 9B:
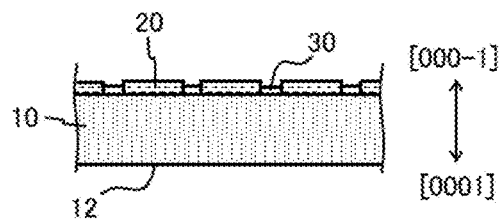

FIG. 9B illustrates a GaN crystal 30 at the beginning of its growth on the nitrogen polar surface 11 exposed inside the linear openings 21 provided in the pattern mask 20.

Figure 9E:
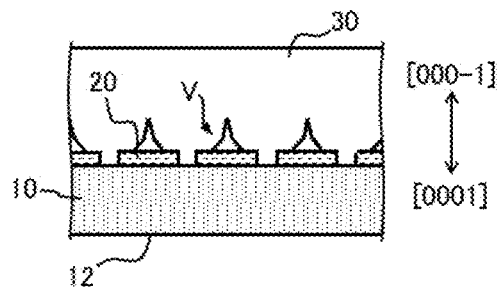
Figure 9C:
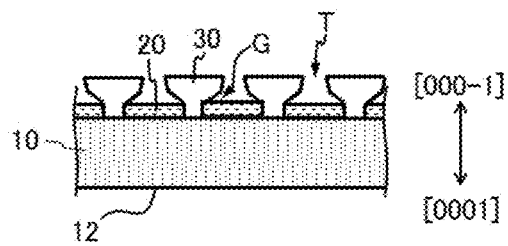

After passing through the pattern mask 20, as FIG. 9C illustrates, the GaN crystal 30 grows not only in the [000-1] direction but also in a lateral direction (a direction parallel to the nitrogen polar surface 11), and gaps G are formed between the GaN crystal 30 and the pattern mask 20. This results in reduction of orientation disorder of the GaN crystal 30, which could be caused by contact with the pattern mask 20.

In the growth stage illustrated in FIG. 9C, the GaN crystal 30 has through-holes T above non-opening parts of the pattern mask 20.

As the GaN crystal 30 further grows, the gaps G are gradually filled but not completely filled up, and as FIG. 9D illustrates, the through-holes T are closed leaving voids V.

After the through-holes T are closed, the GaN crystal 30 is further grown in the [000-1] direction, as illustrated in FIG. 9E. The voids V are considered to relieve the stress generated between the GaN seed 10 and the GaN crystal 30, thereby reducing the distortion of the GaN crystal 30.

The growth amount of the GaN crystal 30 in the [000-1] direction after the closure of the through-holes T is preferably 1 mm or more, more preferably 2 mm or more, and more preferably 3 mm or more and has no particular upper limit.

Note that in the step S3, the growth of a GaN crystal also occurs on the gallium polar surface 12 of the GaN seed 10, although illustration of which is omitted in FIGS. 9A to 9E.

Either because dislocations have been generated at a coalescence boundary surface or been bent all together in the [000-1] direction at a coalescence boundary surface when the through-holes T close at the stage in FIG. 9D, or for both of these reasons, a dislocation array appears on a main surface of a C-plane GaN substrate cut out from a GaN crystal formed at the stage in FIG. 9E. The shape of the dislocation array is roughly described as the shape of an intersection line formed by an extension of the coalescence boundary surface extended in the [000-1] direction and the main surface of the C-plane GaN substrate. The intersection may include a straight portion, a curved portion, a bend, and a junction. It can be said that the dislocation array is a mark indicative of a place where coalescence occurred during the growth process of a GaN crystal forming the substrate.

Since the coalescence boundary surface is formed above a non-opening part of the pattern mask, when the pattern mask has a plurality of closed non-opening parts, a plurality of dislocation arrays discretely appear on the main surface of the C-plane GaN substrate.

When the plurality of closed non-opening parts are in a periodic arrangement in the pattern mask, the plurality of dislocation arrays are also in a periodic arrangement on the main surface of the C-plane GaN substrate. When the plurality of closed non-opening parts are in a two-dimensional arrangement in the pattern mask, the plurality of dislocation arrays are also in a two-dimensional arrangement on the main surface of the C-plane GaN substrate.

The closed non-opening part means a non-opening part whose periphery is surrounded by linear openings, and may be referred to as a non-opening part whose outline forms a loop. Among the various examples illustrated in FIGS. 4A to 6D, the pattern mask with closed non-opening parts is illustrated in FIGS. 4C, 4D, 5A-5D, and 6A-6C. In each of these examples, the closed non-opening parts are in a periodical and two-dimensional arrangement in the pattern mask.

The present inventors have found out that comparing when a periodical opening pattern provided on a pattern mask is a quadrangular grid pattern including intersections with when the pattern is a stripe pattern including no intersection, it is when the pattern is a quadrangular grid pattern that the growth of a GaN crystal more easily proceeded from the stage in FIG. 9C to the stage in FIG. 9D, that is, through-holes created in the GaN crystal more easily close.

As to the reason for this, the present inventors consider that the re-entrant angle effect to be described below is relevant.

Figure 10A:
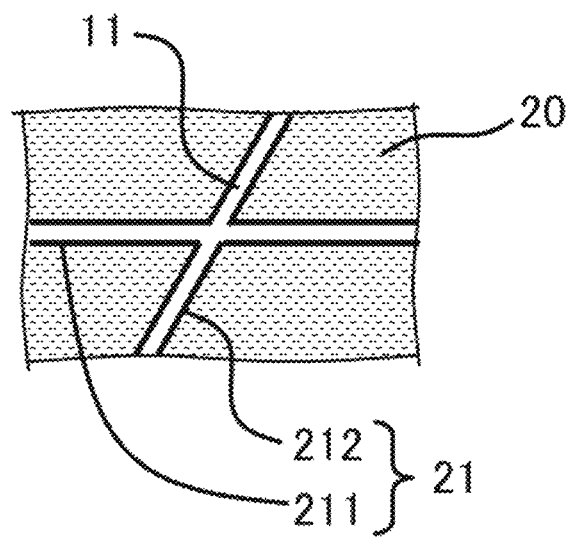
FIG. 10A is a plan view illustrating part of the nitrogen polar surface side of a GaN seed after arrangement of a pattern mask in which linear openings form a continuous intersection.

FIG. 10A is a plan view illustrating part of the nitrogen polar surface side of a GaN seed on which a pattern mask having linear openings forming an intersection is arranged. The pattern mask 20 is provided with the first linear opening 211 and the second linear opening 212 whose longitudinal directions differ from each other, and a continuous intersection is formed by the two kinds of linear openings.

Figure 10B:
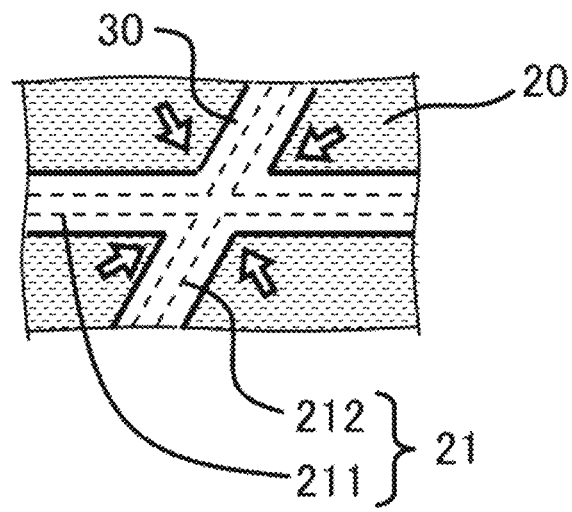
FIG. 10B is a plan view illustrating a GaN crystal grown through the pattern mask illustrated in FIG. 10A and in an early growth stage.

FIG. 10B illustrates a state where the GaN crystal 30 at the growth stage in FIG. 9C is formed on the GaN seed illustrated in FIG. 10A. The GaN crystal 30 has grown along the linear openings 21. The broken lines indicate the profiles of the linear openings 21 hidden below the GaN crystal 30.

The four arrows in FIG. 10B each point to a re-entrant portion formed on the side of the GaN crystal 30 growing over the intersection formed by the linear openings 211 and 212. The directions of the arrows represent re-entrant directions of the re-entrant portions.

Formation of such re-entrant portions produces the re-entrant angle effect, which promote the growth of the GaN crystal 30 in the directions opposite to the arrows. In other words, the re-entrant angle effect produces driving force for a GaN crystal to grow in such a manner to cause through-holes created above non-opening parts of the pattern mask to close.

The same mechanism occurs when the linear openings form a discontinuous intersection rather than a continuous intersection. This will be described referring to FIGS. 11A and 11B.

Figure 11A:
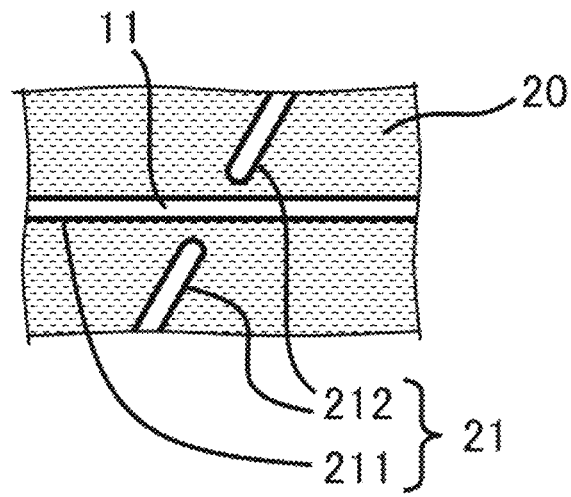
FIG. 11A is a plan view illustrating part of the nitrogen polar surface side of a GaN seed after arrangement of a pattern mask in which linear openings form a discontinuous intersection.

FIG. 11A is a plan view illustrating part of the nitrogen polar surface side of a GaN seed on which a pattern mask having linear openings forming a discontinuous intersection is arranged. The discontinuous intersection is formed by the first linear opening 211 and the second linear opening 212 which is divided into two.

Figure 11B:
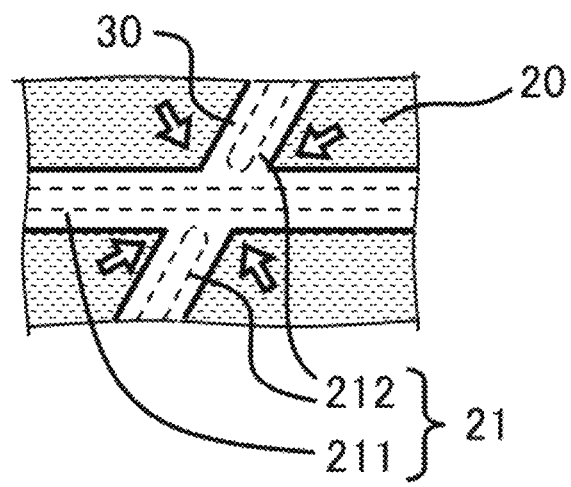
FIG. 11B is a plan view illustrating a GaN crystal grown through the pattern mask illustrated in FIG. 11A and in an early growth stage.

When a GaN crystal is grown on this GaN seed, since the distance between the first linear opening 211 and the second linear opening 212 is small at the discontinuous intersection, the GaN crystal at the growth stage illustrated in FIG. 9C has the same shape as when grown over a continuous intersection. Specifically, as illustrated in FIG. 11B, the GaN crystal 30 growing over the discontinuous intersection has sides on which re-entrant portions indicated by the arrows are formed. The resultant re-entrant angle effect promotes the growth of the GaN crystal 30 in the directions opposite to the arrows.

A person skilled in the art would be able to understand that the above-described re-entrant angle effect can be produced when a GaN crystal is grown on the various intersections illustrated in FIGS. 7A to 8F.

The present inventors have found that the orientations of linear openings in the pattern mask can affect the quality of a GaN crystal grown through the pattern mask. This will be described referring to FIGS. 12 to 14.

Figure 12:
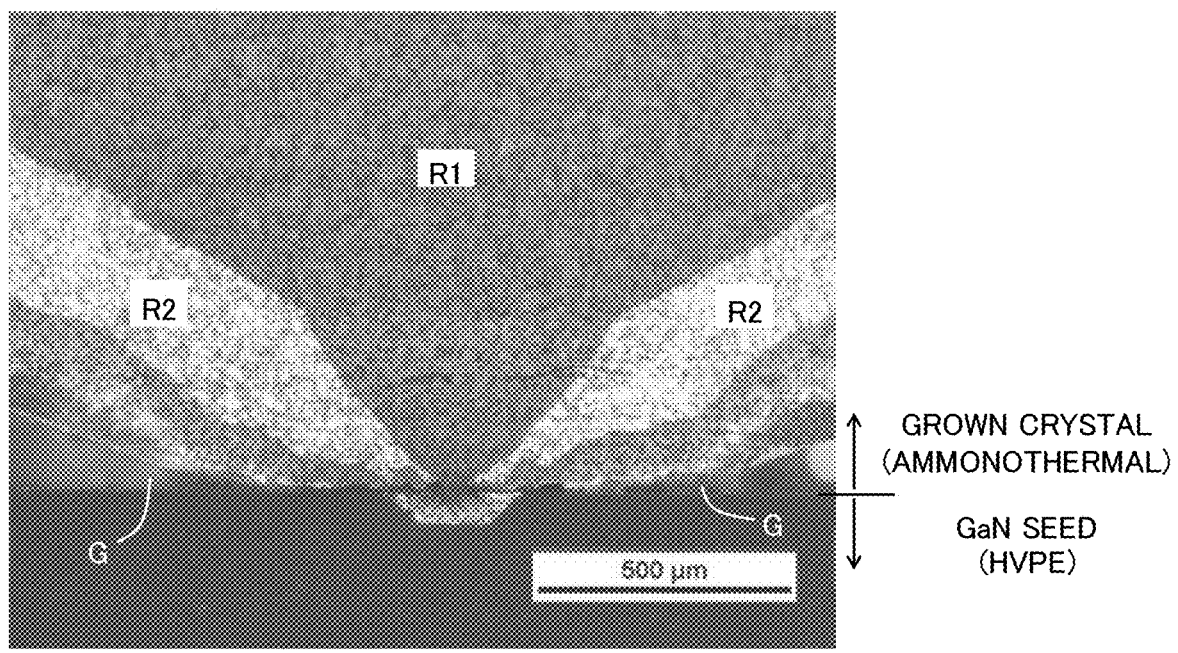
FIG. 12 is a cross-sectional fluorescence microscopic image (photograph serving as a drawing) of a GaN crystal ammonothermally grown on a nitrogen polar surface of a GaN seed through a pattern mask.
Figure 13:
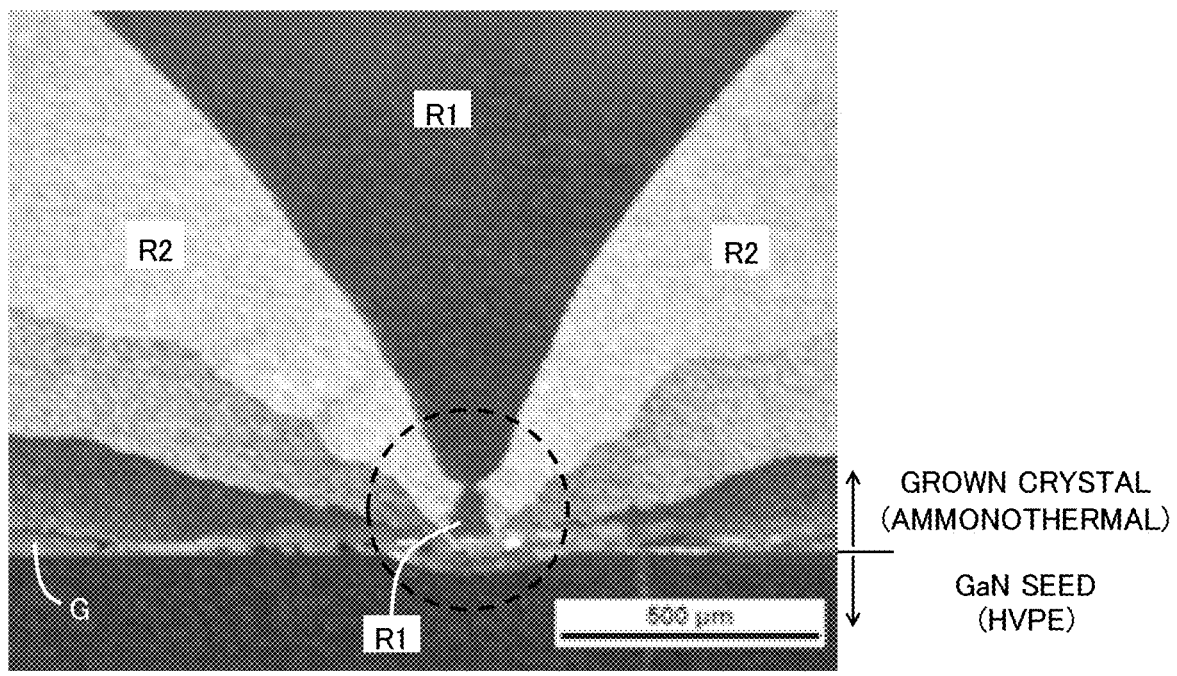
FIG. 13 is a cross-sectional fluorescence microscopic image (photograph serving as a drawing) of a GaN crystal ammonothermally grown on a nitrogen polar surface of a GaN seed through a pattern mask.
Figure 14:
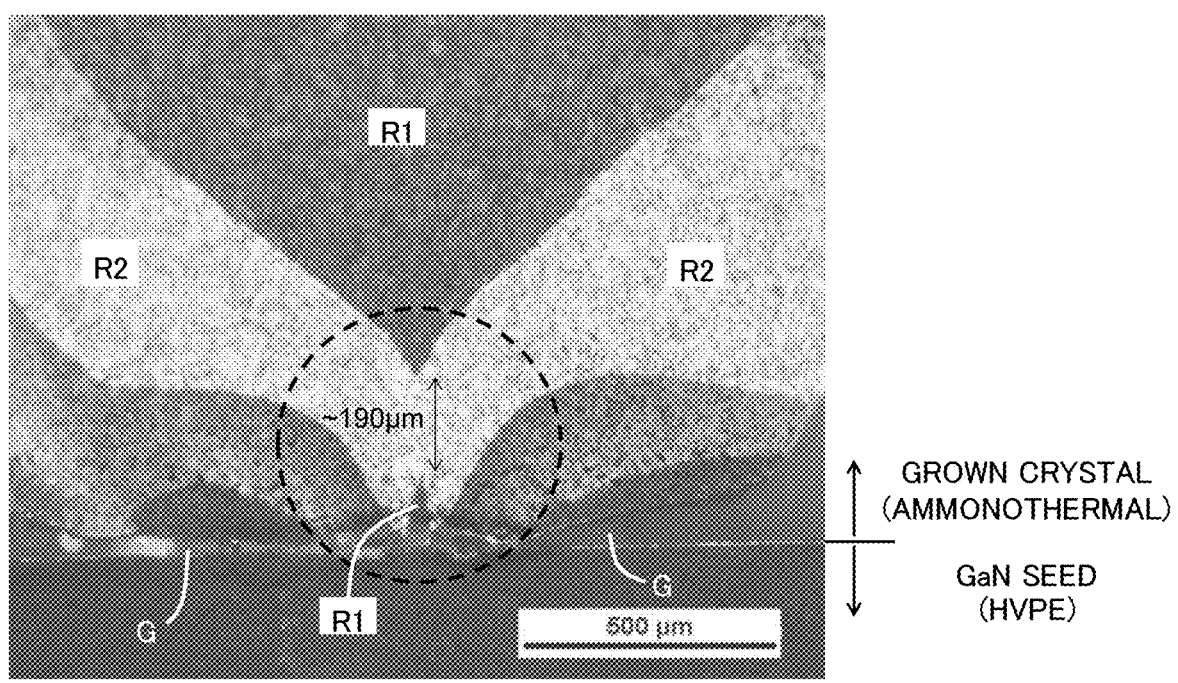
FIG. 14 is a cross-sectional fluorescence microscopic image (photograph serving as a drawing) of a GaN crystal ammonothermally grown on a nitrogen polar surface of a GaN seed through a pattern mask.

FIGS. 12 to 14 are each a cross-sectional fluorescence microscopic image of a GaN crystal ammonothermally grown on the nitrogen polar surface of a GaN seed through a pattern mask.

In the pattern mask used in growing the GaN crystal in FIG. 12, the longitudinal direction of linear openings was tilted about 12° from the direction of the intersection line between the nitrogen polar surface and the M-plane of the GaN seed. In the pattern mask used in growing the GaN crystal in FIG. 13, the longitudinal directions of the linear opening was tilted about 6° from the direction of the aforementioned intersection line. In the pattern mask used in growing the GaN crystal in FIG. 14, the longitudinal direction of the linear openings was parallel to the aforementioned intersection line.

Referring to FIG. 12, the portion which looks the darkest is the cross section of the GaN seed. This GaN seed looks dark in the fluorescence microscopic image because the GaN seed comprises a GaN crystal grown by an HVPE method and having a low point defect density.

The depression with an inversed trapezoidal cross section found in the surface of the GaN seed is considered to be formed by partial etchback of the GaN seed at the opening of the pattern mask before the start of ammonothermal growth of the GaN crystal. The depression has a greater width than the line width of the linear opening provided in the pattern mask, which shows that etching proceeded also in the lateral direction below the pattern mask.

The GaN crystal ammonothermally grown on the GaN seed (hereinafter also referred to as "grown crystal") has a relatively high low point defect density and therefore looks brighter than the GaN seed. The inside of the above-described depression with the inversed trapezoidal cross section formed in the GaN seed is filled up with the grown crystal.

In the cross section of the grown crystal, an N-face growth region R1 and a lateral growth region R2 with different contrasts are observed.

The N-face growth region R1 is a region comprising a GaN crystal which has grown with its N-face, namely (000-1) surface as a growth surface, and the propagation direction of a threading dislocation within the region is the [000-1] direction.

The lateral growth region R2 is a region comprising a GaN crystal which has grown with a crystal surface tilted relative to the (000-1) surface as a growth surface, and the propagation direction of a threading dislocation within the region is tilted relative to the [000-1] direction.

The difference in the contrast between the N-face growth region R1 and the lateral growth region R2 reflects the difference in the growth surface, that is, the difference in the concentrations of impurities and/or defects caused by the difference in the crystal surface which was exposed when each region was formed.

It is realized from FIG. 12 that immediately following filling up of the inside of the depression with the inversed trapezoidal cross section in the GaN seed surface, formation of the N-face growth region R1 starts, and the N-face growth region R1 continues in the [000-1] direction without being interrupted. Accordingly, the threading dislocations inherited from the GaN seed to the grown crystal are considered to have reached the top of the grown crystal without changing their propagation directions.

In FIG. 13, the N-face growth region R1 and the lateral growth region R2 are observed in the grown crystal in the same manner as in FIG. 12, except that when focusing on the part circled by a dotted line, the N-face growth region R1, which starts from the vicinity of the opening of the pattern mask, is constricted at a location where the GaN crystal has grown about 100 μm in the [000-1] direction. This suggests the possibility that some, but presumably not many, of the threading dislocations inherited from the GaN seed to the grown crystal were bent at the constricted part of the N-face growth region R1 and changed their propagation directions.

On the other hand, in FIG. 14, when focusing on the part circled by a dotted line, the N-face growth region R1, which starts from the vicinity of the opening of the pattern mask, is completely interrupted at a location where the GaN crystal has grown about 140 μm in the [000-1] direction. The lateral growth region R2 continues for about 190 μm until the N-face growth region R1 appears again in the upper part. Accordingly, among the threading dislocations the grown crystal inherited from the GaN seed, the ratio of those not reaching the top of the grown crystal because of a change in their propagation direction is presumably higher than the ratio in the crystal in FIG. 13.

The above observation results suggest that the higher the parallelism between the longitudinal direction of a linear opening provided in a pattern mask and an intersection line between the nitrogen polar surface and the M-plane in a GaN seed is, the more difficult it is for a threading dislocation inherited from the GaN seed to the grown crystal to reach the top of the grown crystal.

A crystal growth apparatus and crystal growth conditions which may be preferably used in the step S3 will be described below.

Figure 15:
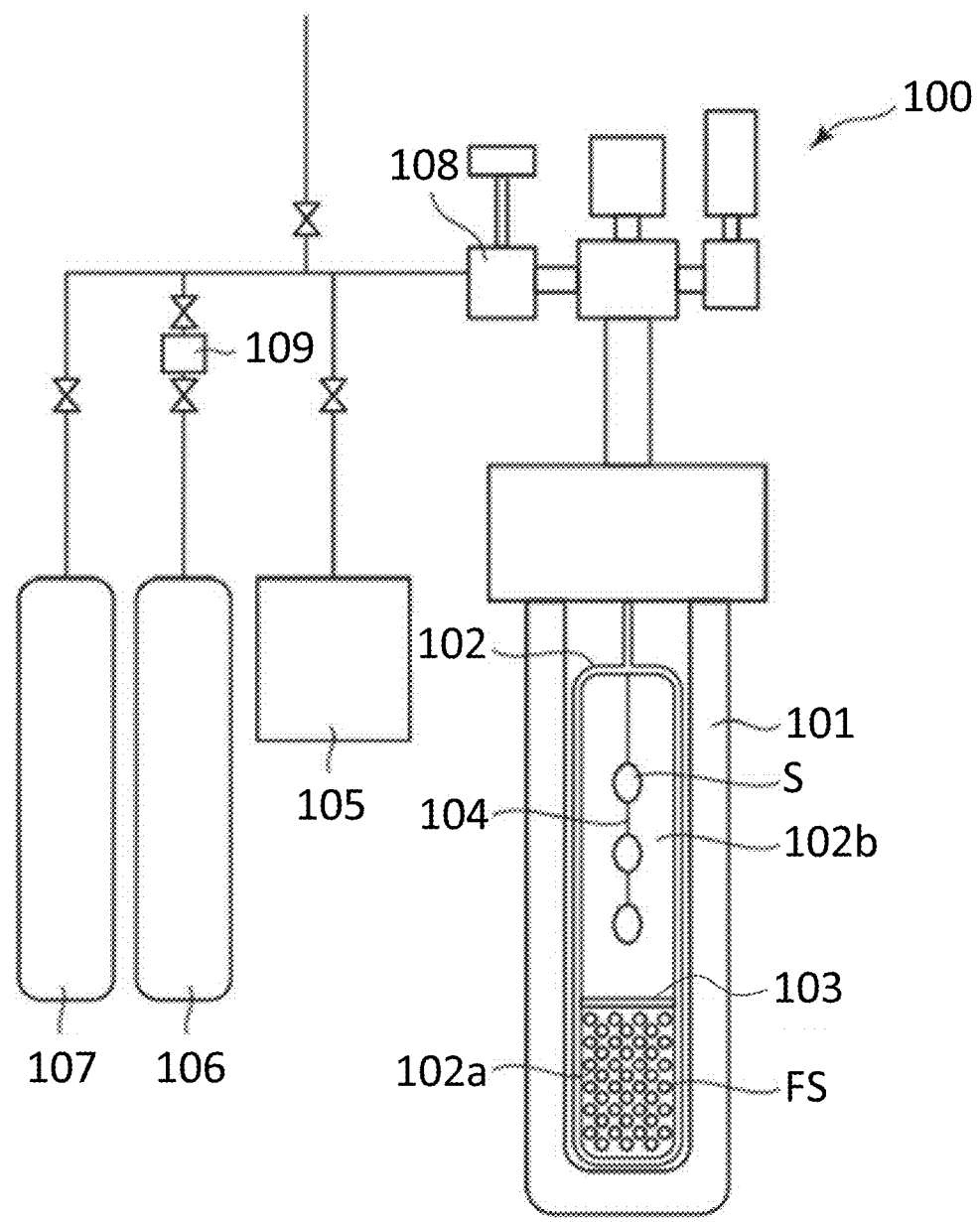
FIG. 15 illustrates a crystal growth apparatus which may be used for growing a GaN crystal by an ammonothermal method.

A crystal growth apparatus of the type illustrated in FIG. 15 may be preferably used for growing the GaN crystal by an ammonothermal method in the step S3.

Referring to FIG. 15, the crystal growth apparatus 100 is provided with an autoclave 101 and a capsule 102 which is placed in the autoclave and made of platinum.

The capsule 102 has therein a feedstock dissolution zone 102a and a crystal growth zone 102b which are partitioned from each other with a baffle 103 made of platinum. A feedstock FS is placed in the feedstock dissolution zone 102a. In the crystal growth zone 102b, a seed S is placed, hung by a Pt wire 104.

A gas line to which a vacuum pump 105, an ammonia cylinder 106, and a nitrogen cylinder 107 are connected is connected to the autoclave 101 and the capsule 102 via a valve 108. When $NH_3$ (ammonia) is introduced into the capsule 102, an amount of $NH_3$ supplied from the ammonia cylinder 106 is checkable with a mass flow meter 109.

As a feedstock, polycrystalline GaN produced by a method of reacting $NH_3$ gas with gaseous GaCl obtained by bringing a Ga simple substance (metallic gallium) into contact with HCl (hydrogen chloride) gas under heating, may be preferably used.

As a mineralizer to promote dissolution of the feedstock, one or more ammonium halides selected from $NH_4Cl$ (ammonium chloride), $NH_4Br$ (ammonium bromide), and $NH_4I$ (ammonium iodide) are preferably used in combination with $NH_4F$. Particularly preferably, $NH_4F$ and $NH_4I$ are used in combination.

When a growth temperature of 650° C. or less is used, it is not recommended to use ammonium halides other than $NH_4F$, singly as a mineralizer, because that will cause a GaN crystal to grow substantially only in the [000-1] direction, and no growth will occur in the lateral direction.

On the other hand, when $NH_4F$ is used singly as a mineralizer, the growth in the lateral direction is strongly promoted. When the growth in the lateral direction is promoted too much, it becomes difficult to grow a GaN crystal in the form illustrated in FIG. 9, that is, to grow a GaN crystal such that gaps are formed between the GaN crystal and a pattern mask.

When the GaN crystal is grown on the seed S, $NH_3$ is introduced also in a space between the autoclave 101 and the capsule 102, and a supercritical or subcritical state is created inside the capsule 102 by heating it from the outside of the autoclave 101 with a heater (not illustrated).

Etching occurs also on the surface of the seed S until the feedstock FS sufficiently dissolves and a solvent reaches saturation. If necessary, with a view to prompting etchback of the seed S before the growth starts, an inversion period in which the temperature gradient between the feedstock dissolution zone 102a and the crystal growth zone 102b is the inverse of that during crystal growth, may be provided.

The growth temperature is preferably 550° C. or higher. Although use of a growth temperature of 1000° C. or more is not precluded, a GaN crystal of a sufficiently high quality can be grown even at a growth temperate of 700° C. or less.

The growth pressure may be set for example within a range of 100 to 250 MPa, but is not limited thereto.

In one example, GaN may be grown under the following conditions: $NH_4F$ and $NH_4I$ used as mineralizers are 0.5% and 4.0%, respectively, in terms of molar ratio to $NH_3$; the pressure is about 220 MPa; the average value of a temperature Ts in the feedstock dissolution zone and a temperature Tg in the crystal growth zone is about 600° C.; and the temperature difference Ts–Tg between these two zones is about 5° C. (Ts>Tg).

In another example, GaN may be grown under the following conditions: $NH_4F$ and $NH_4I$ used as mineralizers are each 1.0% in terms of molar ratio to $NH_3$; the pressure is about 220 MPa; the average value of the temperature Ts in the feedstock dissolution zone and the temperature Tg in the crystal growth zone is about from 605 to 610° C.; and the temperature difference Ts–Tg between these two zones is about from 5 to 10° C. (Ts>Tg).

Although it is possible to raise the growth rate of a GaN crystal by increasing the temperature difference between the feedstock dissolution zone and the crystal growth zone, a too high growth rate can cause a problem that the growth of the GaN crystal has difficulty in proceeding from the stage in FIG. 9C to the stage in FIG. 9D, in other words, the through-holes in the GaN crystal have difficulty in closing.

In the Step S3, the capsule may be replaced whenever the feedstock is exhausted, to repeat regrowth of the GaN crystal.

To impart conductivity to a GaN crystal to be grown, doping with O (oxygen), Si (silicon), Ge (germanium), S (sulfur) or the like may be carried out.

According to the present inventors' findings, when the GaN crystal grown in the step S3 is doped with O, the n-type carrier concentration of the O-doped GaN crystal is from 20 to 70% of the O concentration and often less than 30%. Accordingly, in order to obtain a GaN crystal having an n-type carrier concentration of, for example, $1 \times 10^{18}$ cm$^{-3}$ or more, O is added at a concentration of at least $2 \times 10^{18}$ atoms/cm$^3$ and preferably $4 \times 10^{18}$ atoms/cm$^3$.

To grow the O-doped GaN crystal by an ammonothermal method, O in the form of moisture may be introduced into a growth vessel (in the example in FIG. 15, the capsule 102) or the polycrystalline GaN used as the feedstock may be doped with O. It is also possible to use both procedures in combination.

To make the grown GaN crystal semi-insulating, doping with iron (Fe), manganese (Mn), cobalt (Co), nickel (Ni), copper (Cu), magnesium (Mg) or the like may be carried out.

By processing the GaN crystal grown in the step S3, GaN substrates having various plane orientations can be produced. The processing may include slicing the GaN crystal with a slicer such as a single-wire saw and a multi-wire saw. The slice thickness may be determined as appropriate according to the purpose and is usually not less than 100 μm and not more than 20 mm.

Planarization of a cut face of the GaN crystal may be carried out by any one or both of grinding and lapping. Removal of a damaged layer from the cut face may be carried out by any one or both of CMP and etching.

Figure 16A:
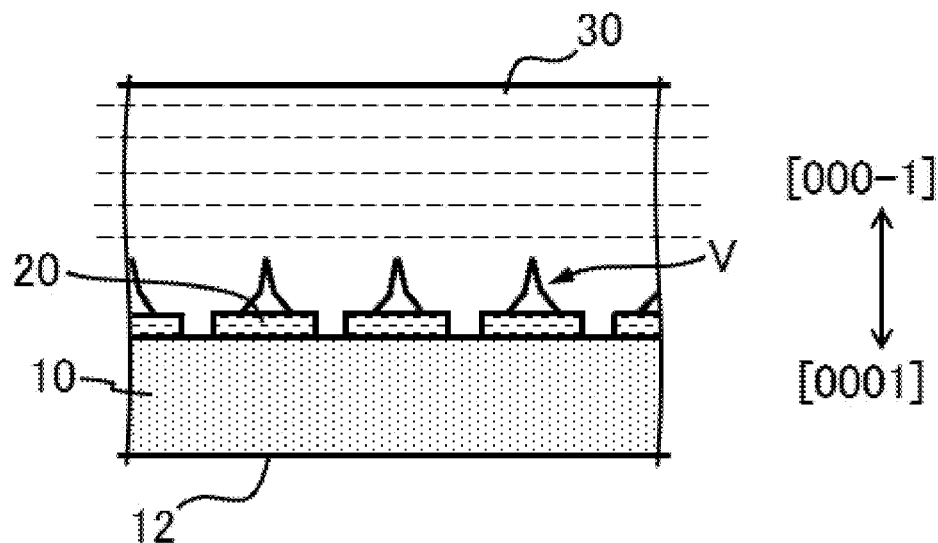
FIGS. 16A and 16B are cross sectional views each illustrating positions at which a GaN crystal is sliced.

When the GaN crystal 30 grown in the step S3 is sliced parallel to or substantially parallel to the C-plane to produce a C-plane GaN substrate, slicing at position indicated by the broken lines in FIG. 16A provides a C-plane GaN substrate without any through hole. Such a substrate is preferably usable as a substrate for semiconductor devices and also may be used for production of a GaN layer-bonded substrate or may be used as a seed in growing a bulk GaN crystal by various crystal growth techniques.

Figure 16B:
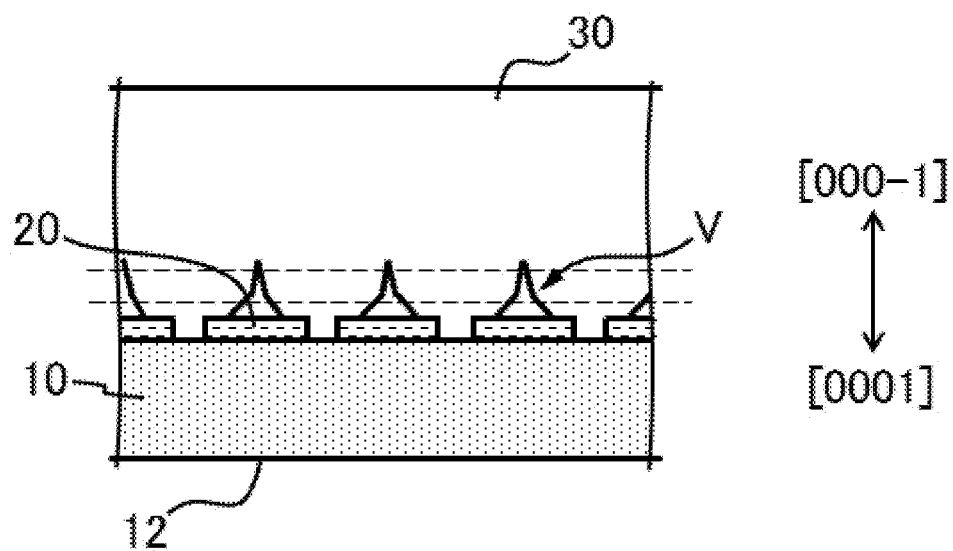

In contrast, slicing the GaN crystal 30 at positions indicated by the broken lines in FIG. 16B provides a C-plane GaN substrate which have through-holes on the main surface and are hence unsuitable for use as a substrate for semiconductor devices. Thus obtained substrate is however usable as a seed in ammonothermally growing a bulk GaN crystal using an acidic mineralizer containing F, because when an acidic mineralizer contains F, even if a seed has a through-hole, a GaN crystal grows in a manner to close the through hole.

In one example, in the step S3, the growth of the GaN crystal 30 may be terminated while the growth of the GaN crystal 30 is yet to proceed to the stage in FIG. 9D, that is, while all or part of the through-holes T remain unclosed. In such a case, regardless of at which position the grown GaN crystal 30 is sliced, only a C-plane GaN substrate having through-holes is obtainable. Thus obtained C-plane GaN substrate is however usable as a seed in ammonothermally growing a bulk GaN crystal using an acidic mineralizer containing F.

2. C-plane GaN Substrate

One embodiment of the present invention relates to a C-plane GaN substrate. The C-plane GaN substrate according to the embodiment can be produced by processing a GaN crystal grown by the GaN crystal growth method described in the section 1.

2.1. Shape and Size

The C-plane GaN substrate according to the embodiment has a main surface on one side and another main surface on the opposite side, and the substrate has a thickness direction parallel or substantially parallel to the c-axis. One of the two main surfaces is a nitrogen polar surface, and the other is a gallium polar surface. The shape of the main surfaces is not particularly limited.

Figure 17A:
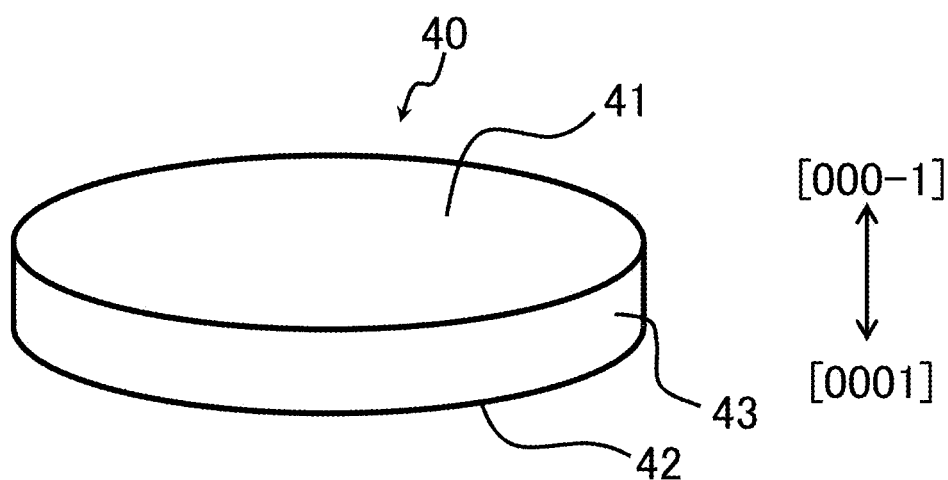
FIGS. 17A and 17B illustrate an example of the shape of a C-plane GaN substrate according to an embodiment, with FIG. 17A being a perspective view and FIG. 17B being a side view.
Figure 17B:
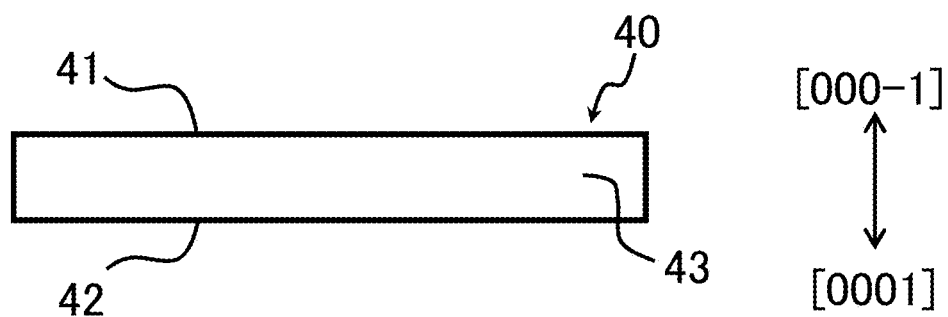

FIGS. 17 and 17B illustrates an example of the shape of the C-plane GaN substrate according to the embodiment, with FIG. 17A being a perspective view and FIG. 17B being a side view.

Referring to FIGS. 17A and 17B, a C-plane GaN substrate 40 is disk-shaped, and the shapes of a nitrogen polar surface 41 as a main surface on the [000-1] side and a gallium polar surface 42 as a main surface on the [0001] side are circular. The nitrogen polar surface 41 and the gallium polar surface 42 are connected to each other via a side surface 43.

The main surface of the C-plane GaN substrate according to the embodiment may have an area of, for example, 15 cm$^2$ or more and less than 50 cm$^2$, 50 cm$^2$ or more and less than 100 cm$^2$, 100 cm$^2$ or more and less than 200 cm$^2$, 200 cm$^2$ or more and less than 350 cm$^2$, 350 cm$^2$ or more and less than 500 cm$^2$, or 500 cm$^2$ or more and less than 750 cm$^2$.

In the C-plane GaN substrate of the embodiment, the gallium polar surface has an orientation of within 10° from [0001].

In the C-plane GaN substrate of the embodiment, the gallium polar surface has an orientation of preferably within 5°, more preferably within 2°, and more preferably within 1° from [0001].

In the C-plane GaN substrate of the embodiment, the nitrogen polar surface has an orientation of within 10°, preferably within 5°, more preferably within 2°, and more preferably within 1° from [000-1].

The gallium polar surface and the nitrogen polar surface are preferably parallel to each other, but are not limited thereto.

When the C-plane GaN substrate of the embodiment is disk-shaped, the substrate has a diameter of usually not less than 45 mm and not more than 305 mm. The diameter is typically from 45 to 55 mm (about 2 inches), from 95 to 105 mm (about 4 inches), from 145 to 155 mm (about 6 inches), from 195 to 205 mm (about 8 inches), from 295 to 305 mm (about 12 inches), or the like.

The thickness of the C-plane GaN substrate according to the embodiment is usually 100 μm or more and may be 150 μm or more and less than 250 μm, 250 μm or more and less than 300 μm, 300 μm or more and less than 400 μm, 400 μm or more and less than 500 μm, 500 μm or more and less than 750 μm, 750 μm or more and less than 1 mm, 1 mm or more and less than 2 mm, 2 mm or more and less than 5 mm, or the like. The thickness has no particular upper limit, but is usually 20 mm or less.

In the C-plane GaN substrate according to the embodiment, the boundary between the gallium polar surface and the side surface may be chamfered. The same is true for the boundary between the nitrogen polar surface and the side surface.

The C-plane GaN substrate according to the embodiment may be provided with various markings as necessary, such as an orientation flat or notch representing a crystal orientation and an index flat for facilitating discrimination between the gallium polar surface and the nitrogen polar surface.

2.2. Dislocation Array

The C-plane GaN substrate of the embodiment may have a lined-up group of dislocations, namely a dislocation array, on a main surface thereof. The dislocation mentioned here refers to an endpoint of a threading dislocation (an edge dislocation, a screw dislocation, and a mixed dislocation).

On a main surface of the C-plane GaN substrate of the embodiment, a plurality of the dislocation arrays may be periodically arranged. The arrangement of the plurality of the dislocation arrays may be two-dimensional and may further have periodicity in two or more directions.

On a main surface of the C-plane GaN substrate according to a preferred example no periodically arranged groups of dislocations except the above-described plurality of the dislocation arrays is present.

The presence or absence, shape, arrangement, and the like of the dislocation array on a main surface of a C-plane GaN substrate is confirmable with an optical microscope by etching the main surface under suitable conditions to form etch pits at endpoints of threading dislocations. It is only necessary to make confirmation at least on one of the gallium polar surface and the nitrogen polar surface.

In the case of the gallium polar surface, by etching the surface for 1 hour or longer using 89% sulfuric acid heated to 270° C. as an etchant, etch pits corresponding to all kinds of threading dislocations present on the surface can be formed.

For example, when a GaN crystal is grown by the GaN crystal growth method describe in the section 1. followed by production of a C-plane GaN substrate from the grown GaN crystal, a dislocation array derived from coalescence which occurs above a non-opening part of a pattern mask in the step S3 is present on a main surface of the produced C-plane GaN substrate.

In particular, when a pattern mask having a closed non-opening part is formed on a GaN seed in the step S2, a dislocation array corresponding to the non-opening part appears on a main surface of the obtained C-plane GaN substrate.

When the number of the closed non-opening part the pattern mask formed in the step S2 has is plural, a plurality of dislocation arrays appear on a main surface of the obtained C-plane GaN substrate, and the arrangement of the plurality of dislocation arrays reflects the arrangement of the closed non-opening parts in the pattern mask.

Accordingly, a C-plane GaN substrate produced from a GaN crystal grown by the GaN crystal growth method described in the section 1. may have a plurality of dislocation arrays periodically arranged on a main surface thereof. The arrangement of the plurality of dislocation arrays may be two-dimensional and may further have periodicity in two or more directions.

As described in the section 1.2., in the step S2, only linear openings parallel to the intersection line between the nitrogen polar surface and the M-plane of a GaN seed may be provided in a pattern mask. In such a case, a dislocation array a C-plane GaN substrate obtained from a GaN crystal grown in the step S3 has on a main surface thereof can only be a dislocation array derived from coalescence which occurs above non-opening parts of the pattern mask in the step S3. In other words, it is possible to produce a C-plane GaN substrate having on its main surface no group of dislocations formed of threading dislocations which the GaN crystal grown in the step S3 inherited from the GaN seed.

This is because as shown in FIG. 14, at the time when a region parallel to the (000-1) plane temporarily disappears from the growth surface of a GaN crystal above a linear opening parallel to the intersection between the nitrogen polar surface and the M-plane of a GaN seed, the propagation direction of a threading dislocation inherited from the GaN seed to the GaN crystal is bent in the lateral direction. This results in that even when threading dislocations forming a group are inherited from the GaN seed to the GaN crystal, the threading dislocations are not able to propagate to the top of the growing GaN crystal while keeping the group formed.

For example, in the GaN crystal growth method described in the section 1., even when a GaN seed prepared in the step S1 has a dislocation density of from $10^6$ to $10^7$ cm$^{-2}$, when the periodical opening pattern of a pattern mask provided on the GaN seed in the step S2 is formed only of linear openings parallel to the intersection line between the nitrogen polar surface and the M-plane of the GaN seed, no periodical pattern formed of dislocations inherited from the GaN seed is observed on the surface of a C-plane GaN substrate produced from a GaN crystal grown in the Step S3.

In contrast, if the periodical opening pattern of a pattern mask provided on the same GaN seed is not as in the embodiment of the present invention but formed only of linear openings tilted about 12° from the intersection line between the nitrogen polar surface and the M-plane of the GaN seed, a periodical pattern formed of dislocations inherited from the GaN seed is observed on the surfaces of the resultantly obtained C-plane GaN substrates. The observed periodical pattern is substantially the same pattern as the periodical opening pattern of the pattern mask.

2.3. Electrical Properties

The C-plane GaN substrate of the embodiment may be either n-type conductive, p-type conductive, or semi-insulating.

The case where the C-plane GaN substrate of the embodiment is n-type conductive will be described as follows.

Preferably, the n-type C-plane GaN substrate of the embodiment has a resistivity of $2.0 \times 10^{-2}$ Ω·cm or less at room temperature. Although there is no lower limit on the resistivity from the view point of electrical properties, when it is necessary to particularly consider effects of dopant addition on the quality of the GaN crystal forming the substrate, the resistivity is set to preferably $2 \times 10^{-3}$ Ω·cm or more and more preferably $5 \times 10^{-3}$ Ω·cm or more.

The n-type carrier concentration of the n-type C-plane GaN substrate of the embodiment determined based on measurement of the Hall effect by the van der Pauw method is preferably $1 \times 10^{18}$ cm$^{-3}$ or more, more preferably $2 \times 10^{18}$ cm$^{-3}$ or more, and more preferably $3 \times 10^{18}$ cm$^{-3}$ or more at room temperature. The n-type carrier concentration may be $5 \times 10^{18}$ cm$^{-3}$ or more. From the view of the electrical properties, there is no upper limit on the carrier concentration. When it is necessary to particularly consider effects of dopant addition on the quality of the GaN crystal forming the substrate, the carrier concentration is set to preferably $1 \times 10^{20}$ cm$^{-3}$ or less, more preferably $5 \times 10^{19}$ cm$^{-3}$ or less, and more preferably $2 \times 10^{19}$ cm$^{-3}$ or less.

The Hall effect measurement by the van der Pauw method may be performed by cutting a C-plane GaN substrate to make a plate specimen having a main surface of a 1×1 cm$^2$ square and bonding lead wires to the four corners of the specimen using indium solder or the like.

The above-described resistivity and carrier concentration may be set such that the Hall mobility is 120 cm$^2$/V·s or more and more preferably 150 cm$^2$/V·s or more.

2.4. Impurity

Generally, concentrations of various impurities contained in a GaN crystal are measured by SIMS (Secondary Ion Mass Spectrometry). Impurity concentrations as will be mentioned below are values measured by SIMS at a depth of 1 μm or more from a substrate surface.

In the C-plane GaN substrate of the embodiment, concentrations of alkaline metals and alkaline earth metals are preferably less than $1 \times 10^{16}$ atoms/cm$^3$ and more preferably less than $1 \times 10^{15}$ atoms/cm$^3$. In a GaN crystal ammonothermally grown in a capsule made of Pt (platinum) using ammonium halide as a mineralizer, Li (lithium), Na (sodium), K (potassium), Mg (magnesium), and Ca (calcium) each usually have a concentration of less than $1 \times 10^{16}$ atoms/cm$^3$, unless intentional added.

The C-plane GaN substrate of the embodiment may contain a halogen derived from a mineralizer used in crystal growth. For example, a GaN crystal grown using NH$_4$F as a mineralizer may contain F (fluorine) at a concentration of $5 \times 10^{14}$ atoms/cm$^3$ or more and less than $1 \times 10^{16}$ atoms/cm$^3$, $1 \times 10^{16}$ atoms/cm$^3$ or more and less than $1 \times 10^{17}$ atoms/cm$^3$, or the like. Experiments by the present inventors have confirmed that a GaN crystal ammonothermally grown using NH$_4$F and NH$_4$I as mineralizers usually has an I (iodine) concentration of less than $1 \times 10^{16}$ atoms/cm$^3$.

The C-plane GaN substrate of the embodiment may have an H concentration of $5 \times 10^{17}$ atoms/cm$^3$ or more. The H concentration is usually of the order of $10^{21}$ atoms/cm$^3$ or less, and may be $5 \times 10^{20}$ atoms/cm$^3$ or less, $1 \times 10^{20}$ atoms/cm$^3$ or less, or $5 \times 10^{19}$ atoms/cm$^3$ or less.

Examples of n-type impurities which the C-plane GaN substrate of the embodiment may contain include, without limitation, O (oxygen), Si (silicon), Ge (germanium), and S (sulfur).

The C-plane GaN substrate of the embodiment may be an n-type conductive substrate having an O concentration higher than an n-type carrier concentration at room temperature. In this case, the carrier concentration is usually from 20 to 70% of the O concentration.

In the GaN crystal forming the C-plane GaN substrate of the embodiment, an infrared absorption peak attributable to a gallium vacancy-hydrogen complex may be observed within a range of 3140 to 3200 cm$^{-1}$.

2.5. Use
(1) Nitride Semiconductor Device

The C-plane GaN substrate of the embodiment may be preferably used for production of nitride semiconductor devices.

Usually, one or more nitride semiconductors are epitaxially grown on the C-plane GaN substrate of the embodiment to form an epitaxial substrate provided with a semiconductor device structure. Preferably usable epitaxial growth methods include, without limitation, a MOCVD method, an MBE method, and a pulse deposition method, which are vapor phase methods suitable for forming thin films.

The semiconductor device structure may be formed on any of the gallium polar surface and the nitrogen polar surface.

After being subjected to semiconductor processing including etching and provision with structures such as electrodes and protective films, the epitaxial substrate is divided into nitride semiconductor device chips.

Specific examples of the nitride semiconductor device which can be produced using the C-plane GaN substrate of the embodiment include light emitting devices such as light emitting diodes and laser diodes, electronic devices, such as rectifiers, bipolar transistors, field effect transistors, and HEMTs (High Electron Mobility Transistors), semiconductor sensors such as temperature sensors, pressure sensors, radiation sensors, and visible-ultraviolet light detectors, and solar cells.

In addition, the C-plane GaN substrate of the embodiment may be also used for applications such as SAW (Surface Acoustic Wave) devices, vibrators, resonators, oscillators, MEMS (Micro Electro Mechanical System) components, voltage actuators, and electrodes for artificial photosynthetic devices.

(2) GaN Layer-Bonded Substrate

In one example, GaN layer-bonded substrates may be produced using the C-plane GaN substrate of the embodiment.

A GaN layer-bonded substrate is a composite substrate having a structure in which a GaN layer is bonded to a heterogeneous substrate having a chemical composition different from that of GaN, and may be used for producing light emitting devices and other semiconductor devices. Examples of the heterogeneous substrate include sapphire substrates, AlN substrates, SiC substrates, ZnSe substrates, Si substrates, ZnO substrates, ZnS substrates, quartz substrates, spinel substrates, carbon substrates, diamond substrates, Ga$_2$O$_3$ substrates, ZrB$_2$ substrates, Mo substrates, W substrates, and ceramic substrates.

With regard to details of the structure, production methods, applications, and others of GaN layer-bonded substrates, reference may be made to, for example, JP-A-2006-210660 and JP-A-2011-44665.

A GaN layer-bonded substrate is typically produced by performing, in the order mentioned below, the steps of implanting ions into the vicinity of a main surface of a GaN substrate, bonding the main surface side of the GaN substrate to a heterogeneous substrate, and separating the GaN substrate at the ion-implanted region as a boundary into two parts to thereby form a GaN layer bonded to the heterogeneous substrate.

Other than the method for producing a GaN layer-bonded substrate which involves ion implantation, there has also been developed a method where a GaN substrate is bonded to a heterogeneous substrate and the GaN substrate is then mechanically cut to form a GaN layer bonded to the heterogeneous substrate.

When the C-plane GaN substrate of the embodiment is used as a material, any one of these production methods provides a GaN layer-bonded substrate having a structure in which a GaN layer separated from the C-plane GaN substrate is bonded to a heterogeneous substrate.

(3) Seed

The C-plane GaN substrate according to the embodiment may be used as a seed in growing a bulk GaN crystal by various methods.

Examples of preferably usable methods for growing bulk GaN include a THVPE (Tri-Halide Vapor Phase Epitaxy) method and an OVPE (Oxide Vapor Phase Epitaxy) method, in addition to an HVPE (Hydride Vapor Phase Epitaxy) method, a sublimation method, an ammonothermal method, and a Na flux method.

With regard to details of a THVPE method, which is a vapor phase growth method of a GaN crystal using GaCl$_3$ and NH$_3$ as raw materials, reference may be made to, for example, WO2015/037232.

With regard to details of an OVPE method, which is a vapor phase growth method of GaN using Ga$_2$O and NH$_3$ as raw materials, reference may be made to, for example, M. Imade, et al., Journal of Crystal Growth, 312 (2010) 676-679.

When the C-plane GaN substrate according to the embodiment is used as a seed to grow a GaN crystal by an acidic ammonothermal method, a growth apparatus of the type illustrated in FIG. 15 may be preferably used.

As a feedstock, polycrystalline GaN produced by a method of reacting NH$_3$ gas with gaseous GaCl obtained by bringing a Ga simple substance into contact with HCl gas under heating, may be preferably used.

As a mineralizer, $NH_4F$ may be preferably used. One or more ammonium halides selected from $NH_4Cl$, $NH_4Br$, and $NH_4I$ may be used in combination with $NH_4F$, and for example, $NH_4F$ and $NH_4I$ may be used in combination.

The concentration of $NH_4F$ may be from 0.1 to 1% in terms of molar ratio to $NH_3$. The concentrations of ammonium halides other than $NH_4F$ may be from 1 to 5% in terms of molar ratio to $NH_3$.

The pressure and the temperature may be set for example within a range of 100 to 250 MPa and within a range of 550 to 650° C., respectively, but are not limited thereto.

A bulk GaN crystal grown using the C-plane GaN substrate according to the embodiment as a seed may be sliced in an arbitrary direction to produce GaN substrates having various plane orientations.

When the C-plane GaN substrate according to the embodiment is assumed to be a first generation substrate and a C-plane GaN substrate produced from a bulk GaN crystal grown using the first generation substrate as a seed is assumed to be a second generation substrate, the second generation substrate may have, on a main surface thereof, a dislocation array similar to a dislocation array which the first generation substrate has on a main surface thereof. The embodiment of the present invention may include the second generation substrate.

A third generation C-plane GaN substrate produced from a bulk GaN crystal grown using the second generation substrate as a seed and a fourth generation C-plane GaN substrate produced from a bulk GaN crystal grown using the third generation substrate as a seed may also have, on their respective main surfaces, dislocation arrays similar to the dislocation array which the first generation substrate has on the main surface thereof. The embodiment of the present invention may include the third generation C-plane GaN substrate and the fourth generation C-plane GaN substrate.

Although the present invention has been described with reference to specific embodiments as above, each embodiment was presented as an example and does not limit the scope of the present invention. Each of the embodiments described herein can be variously modified within the scope not departing from the spirit of the present invention, and can be combined with any feature described in other embodiments as long as such a combination can be carried out.

REFERENCE SIGNS LIST

10 GaN seed
11 nitrogen polar surface
12 gallium polar surface
13 side surface
20 pattern mask
21 linear opening
211 first linear opening
212 second linear opening
30 GaN crystal
G gap
T through-hole
V void
K intersection
40 C-plane GaN substrate
41 nitrogen polar surface
42 gallium polar surface
43 side surface
R1 N-face growth region
R2 lateral growth region
100 crystal growth apparatus
101 autoclave
102 capsule
102a feedstock dissolution zone
102b crystal growth zone
103 baffle
104 Pt wire
105 vacuum pump
106 ammonia cylinder
107 nitrogen cylinder
108 valve
109 mass flow meter
S seed
FS feedstock

What is claimed is:

1. A method for growing a GaN crystal, comprising:
a first step of preparing a GaN seed having a nitrogen polar surface;
a second step of arranging a pattern mask on the nitrogen polar surface of the GaN seed, the pattern mask being provided with a periodical opening pattern comprising linear openings and including intersections, the pattern mask being arranged such that longitudinal directions of at least part of the linear openings are within ±3° from a direction of an intersection line between the nitrogen polar surface and an M-plane; and
a third step of ammonothermally growing a GaN crystal on the nitrogen polar surface of the GaN seed through the pattern mask such that a gap is formed between the GaN crystal and the pattern mask.

2. The growth method according to claim 1, wherein the intersections are continuous intersections.

3. The growth method according to claim 1, wherein mineralizers used in the third step include $NH_4F$ and one or more ammonium halides selected from $NH_4Cl$, $NH_4Br$, and $NH_4I$.

4. The growth method according to claim 3, wherein the mineralizer used in the third step includes $NH_4I$ and $NH_4F$.

5. The growth method according to claim 4, wherein the GaN crystal contains F and I.

6. The growth method according to claim 1, wherein
in the second step, the pattern mask is arranged such that longitudinal directions of portions of the linear openings which account for 50% or more of the total length thereof are within ±3° from a direction of an intersection line between the nitrogen polar surface and an M-plane.

7. The growth method according to claim 1, wherein
in the second step, the pattern mask is arranged such that longitudinal directions of all portions of the linear openings are within ±3° from a direction of an intersection line between the nitrogen polar surface and an M-plane.

8. The growth method according to claim 1, wherein
the arrangement of the intersections in the periodical opening pattern is two-dimensional.

9. The growth method according to claim 8, wherein
the pattern mask includes the intersections at a number density of 1 $cm^{-2}$ or more.

10. The growth method according to claim 9, wherein
the pattern mask includes the intersections at a number density of 20 $cm^{-2}$ or less.

11. The growth method according to claim 1, wherein
every non-opening part included in a unit pattern of the pattern mask is quadrangular or hexagonal, and none of the linear openings included in the pattern mask is arranged at a pitch of less than 1 mm.

12. The growth method according to claim 11, wherein the pattern mask includes the linear openings arranged at a pitch of 10 mm or less.

13. The growth method according to claim 11, wherein the pattern mask includes the linear openings arranged at a pitch of 2 mm or less and the linear openings arranged at a pitch of more than 2 mm, includes the linear openings arranged at a pitch of 3 mm or less and the linear openings arranged at a pitch of more than 3 mm, or includes the linear openings arranged at a pitch of 4 mm or less and the linear openings arranged at a pitch of more than 4 mm.

14. The growth method according to claim 13, wherein the pattern mask includes the linear openings arranged at a pitch of more than 4 mm.

15. The growth method according to claim 1, wherein the periodical opening pattern is a quadrangular grid pattern, and in the second step, the pattern mask is provided with first linear openings and second linear openings where the longitudinal direction of the first linear openings and the longitudinal direction of the second linear openings differ from each other.

16. The growth method according to claim 15, wherein one of a pitch between the first linear openings and a pitch between the second linear openings is not less than 1.5 times the other.

17. The growth method according to claim 1, wherein in the third step, a void is formed between the GaN crystal and the pattern mask.

18. The growth method according to claim 17, wherein in the third step, the GaN crystal is grown such that no through-hole remains above the non-opening parts of the pattern mask.

19. The growth method according to claim 1, wherein the GaN seed has a size of 45 mm or more in all of a [1-100] direction, a [10-10] direction, and a [01-10] direction.

20. The growth method according to claim 1, wherein the GaN crystal has a size of 45 mm or more in all of a [1-100] direction, a [10-10] direction, and a [01-10] direction.

21. The growth method according to claim 1, wherein a C-plane GaN substrate having a size of 45 mm or more in all of a [1-100] direction, a [10-10] direction, and a [01-10] direction can be cut out from the GaN crystal.

* * * * *